United States Patent
Sogard

(10) Patent No.: US 10,054,754 B2
(45) Date of Patent: Aug. 21, 2018

(54) THERMAL REGULATION OF VIBRATION-SENSITIVE OBJECTS WITH CONDUIT CIRCUIT HAVING LIQUID METAL, PUMP, AND HEAT EXCHANGER

(75) Inventor: Michael R. Sogard, Menlo Park, CA (US)

(73) Assignee: Nikon Corporation, Tokyo (JP)

( * ) Notice: Subject to any disclaimer, the term of this patent is extended or adjusted under 35 U.S.C. 154(b) by 1117 days.

(21) Appl. No.: 12/699,767

(22) Filed: Feb. 3, 2010

(65) Prior Publication Data

US 2010/0195074 A1   Aug. 5, 2010

Related U.S. Application Data

(60) Provisional application No. 61/149,961, filed on Feb. 4, 2009.

(51) Int. Cl.
*G03F 7/20* (2006.01)
*F28D 15/00* (2006.01)
(Continued)

(52) U.S. Cl.
CPC ............ *G02B 7/008* (2013.01); *F24J 2/4625* (2013.01); *F28D 15/00* (2013.01); *F28F 13/00* (2013.01); *G03B 27/54* (2013.01); *G03F 7/709* (2013.01); *G03F 7/70891* (2013.01); *H02J 7/025* (2013.01); *H02J 50/10* (2016.02); *F28D 2015/0291* (2013.01); *F28F 2013/005* (2013.01); *Y02E 10/40* (2013.01)

(58) Field of Classification Search
CPC ................................ F24J 2/4625; F28D 15/00
USPC ......................................... 355/76, 72–75, 53
See application file for complete search history.

(56) References Cited

U.S. PATENT DOCUMENTS 5,369,992 A   12/1994   Meng
6,068,449 A    5/2000   Roach
(Continued)

OTHER PUBLICATIONS

Ma et al., "Heat-Driven Liquid Metal Cooling Device for the Thermal Management of a Computer Chip," *J. Phys. D: Appl. Phys.*, 40:4722-4729 (2007).
(Continued)

*Primary Examiner* — Michelle M Iacoletti
(74) *Attorney, Agent, or Firm* — Klarquist Sparkman, LLP

(57) ABSTRACT

An exemplary thermally regulated component is an optical element or chuck for holding an optical element, or a stage for same, or combination thereof. The component has first and second heat-transfer zones. The first has a first component surface that receives a heating influence such as incident electromagnetic radiation. The second has a second component surface. A conduit circuit extends in the component serially through the first and second heat-transfer zones, back to the first heat-transfer zone, and contains an electrically conductive liquid (e.g., liquid metal). A vibration-free pump (e.g., MFD pump) coupled to the conduit circuit induces flow of the liquid through the circuit. A heat-exchanger is in thermal contact, but not actual contact, with the second component surface. Thus, heat delivered to the second heat-transfer zone by the liquid flowing in the conduit circuit flows from the second component surface to the heat-exchanger. The pump can be powered by a periodically remotely charged power source.

101 Claims, 15 Drawing Sheets

(51) Int. Cl.
*F28D 15/02* (2006.01)
*G02B 7/00* (2006.01)
*H02J 50/10* (2016.01)
*F24J 2/46* (2006.01)
*F28F 13/00* (2006.01)
*G03B 27/54* (2006.01)
*H02J 7/02* (2016.01)

(56) References Cited

U.S. PATENT DOCUMENTS

| | | | |
|---|---|---|---|
| 6,705,089 B2* | 3/2004 | Chu et al. | 62/3.2 |
| 6,768,600 B2 | 7/2004 | Dicker | |
| 7,340,904 B2 | 3/2008 | Sauciuc et al. | |
| 7,375,797 B2 | 5/2008 | Phillips | |
| 2005/0160752 A1* | 7/2005 | Ghoshal | G06F 1/203 62/259.2 |
| 2006/0090474 A1* | 5/2006 | Sauciuc et al. | 62/3.2 |
| 2006/0261679 A1* | 11/2006 | Phillips | 310/12 |
| 2010/0110397 A1* | 5/2010 | Phillips | 355/30 |

OTHER PUBLICATIONS

Smither et al., "Liquid Gallium Cooling of Silicon Crystals in High Intensity Photon Beams (Invited)," *Rev. Sci. Instrum.*, 60(7):1486-1492 (1989).

NanoCoolers—Products—Product Overview—www.nanocoolers.com (http://www.nanocoolers.com/products_overview_new.php).

Frigus Primore, "Liquid Metal Cooling" (http://frigprim.com/articels4/LiqMetal.html).

Miner et al., "Cooling of High-Power-Density Microdevices Using Liquid Metal Coolants," *App. Phys. Lett.*, 85(3):506-508 (2004).

Smither et al., "Liquid Gallium Metal Cooling for Optical Elements with High Heat Loads," *Nucl. Instrum. and Meth. in Phys. Res.*, A266: 517-524 (1988).

* cited by examiner

THERMAL REGULATION OF VIBRATION-SENSITIVE OBJECTS WITH CONDUIT CIRCUIT HAVING LIQUID METAL, PUMP, AND HEAT EXCHANGER

CROSS-REFERENCE TO RELATED APPLICATIONS

This application claims priority to and the benefit of U.S. Provisional Patent Application No. 61/149,961, filed on Feb. 4, 2009, which is incorporated herein by reference in its entirety.

FIELD

This disclosure pertains to, inter alia, vibration-sensitive objects and components that are also thermally sensitive and hence require cooling to maintain their temperature at a desired level or range during use. Exemplary objects and components include, but are not limited to, reflective optical elements such as mirrors used in high-energy optical systems, stages for moving and positioning objects in high-precision systems, and chucks and other holders for holding work pieces in high-precision systems. Thermal regulation encompasses cooling or otherwise maintaining a specified temperature of vibration-sensitive objects and components that, for example, are subject to undesired heating when irradiated.

BACKGROUND

In various types of high-precision equipment, constituent components must operate at extremely high performance levels to achieve the specified tolerances of the equipment. An example of such equipment is any of various high-performance optical systems (e.g., astronomical telescopes, space-based optical systems, high-power laser systems, microlithography equipment, electron-beam systems, and inspection equipment), high-precision tools and measurement equipment, and particle accelerators. In an optical system, the constituent optical elements such as lenses, filters, and/or mirrors are impinged with the radiation used with the system. If an optical element absorbs some of the incident radiation and especially if the incident radiation is intense, the element likely will experience substantial heating, which can be detrimental to element and/or system performance. For example, an excessive rise in temperature can thermally distort an optical element, thereby degrading its optical performance. The same applies to stages (e.g., reticle stages and substrate stages in microlithography systems, target stages in particle accelerators, specimen stages in electron microscopy systems) used for moving and positioning things relative to the radiation.

An example of a modern high-precision system is a microlithography system. Microlithography systems include mechanical and optical components that must operate at extremely high levels of performance. Most current microlithography tools use wavelengths of deep ultraviolet (DUV) light (k=150 to 250 nm) for imaging purposes. To achieve further improvement of imaging resolution, substantial research currently is being directed to the development of a practical "extreme ultraviolet" (EUV) microlithography system that utilizes an exposure wavelength in the range of 11 to 14 nm. EUV optical systems are entirely reflective and comprise a plurality of mirrors each having a multilayer EUV-reflective coating on its reflective surface to provide the mirror with a usable reflectivity (approximately 70%, maximum) to EUV radiation at non-grazing angles of incidence.

The mirrors in various high-precision optical systems often require cooling to maintain performance stability. The need for cooling is particularly acute with the mirrors of the illumination unit of a modern EUV microlithography tool, for example. EUV sources are very intense and radiate a large amount of energy (of which a small fraction is actually usable for lithographic exposure), and efforts are ongoing to increase their intensity even further. EUV-reflective mirrors, particularly in the illumination unit, are vulnerable to substantial heating during use because, inter alia, they are located relative close to the EUV source, and their multilayer reflective coatings absorb a substantial amount (with the current best mirrors, approximately 30%) of incident EUV radiation. In the illumination unit the mirror situated closest to the source receives the most illumination energy, up to 1 kW or greater. Downstream mirrors receive correspondingly less radiant energy. If inadequately cooled, the mirror can experience thermal effects (e.g., warping) that can cause an unacceptable degradation of optical performance of and possible fracture or other damage to the mirror.

Most microlithography systems also have other components such as stages and chucks whose operating temperatures must remain within tight limits for optimal performance. An example stage is a reticle stage, which typically includes a reticle chuck. During use the reticle stage and chuck are in-line to receive substantial radiation that can cause heating, in addition to the energy absorbed by the reticle itself. The reticle stage also includes actuators, sensors, and the like that generate heat. This heat usually should be removed to obtain optimal performance of the reticle stage.

One conventional approach to component cooling is passive cooling achieved by, for example, placing the component in contact with a large heat-sink or the like. Unfortunately, this approach is often not effective, particularly if the component is being heated rapidly or is being heated at a variable rate.

Another approach involves circulating water or refrigerant through conduits in the component and/or in a heat sink contacting the component. See, for example, U.S. patent application Ser. No. 12/001,529, filed on Dec. 11, 2007, and incorporated herein by reference. This manner of cooling provides increased rates of heat removal from the component compared to passive cooling. However, under rapid-heating conditions, these coolants may not remove heat sufficiently rapidly at practical liquid flow-rates. Also, whereas increasing the flow-rate of liquid through the conduits increases the rate of heat transfer from the component to the liquid, increased flow-rates are generally more turbulent, which produces vibrations. Also, the conventional manner of routing the coolant liquid to and from the component using external hoses or the like connected to the component usually results in increased vibrations being transmitted to the component.

A conventional cooling scheme is shown in FIG. 10, depicting a component 10 (e.g., mirror) and an external coolant (e.g., water) pump 12. The mirror 10 is mounted to a frame 14 by vibration-isolation or -attenuating mounts 16 that inhibit transmission of vibrations from the frame 14 to the mirror 10. The mirror 10 includes an incidence surface 18 and a body 20. The incidence surface 18 receives heat (arrows 22) from radiation impinging thereon. A coolant channel 24 extends through the body 20, and the pump 12 is connected to the coolant channel 24 by external hoses 26. As the radiation 22 impinges on the surface 18, the surface absorbs some of the incident radiation energy as heat. The heat is conducted through the body 20 to the channel 24 and is transferred to the liquid in the channel. During use of the mirror 10 the pump 12 circulates the liquid through the hoses 26 and coolant channel 24. The hoses 26 are also connected to an external heat-exchanger 28 (e.g., temperature-regulated liquid-cooling device) to remove heat from the liquid before the liquid is returned to the body 20. This conventional cooling scheme is effective for some applications, but is not entirely satisfactory for others, especially applications in which the rate of heat absorption by the mirror is greater than the rate at which heat can be removed by the liquid and/or applications that are too sensitive to vibrations produced by the circulating coolant.

Therefore, a need exists for methods and devices for cooling vibration-sensitive optical and other components in a manner that: (a) inhibits internal generation of vibrations, (b) inhibits transmission of external vibrations to the components, and (c) achieves a satisfactory rate of heat removal.

SUMMARY

In many embodiments the high heat transfer of circulating liquid metal is used to transport heat efficiently from a location, in a vibration-sensitive object, experiencing heating to a location in or on the object where the heat can be transferred to a heat-exchanger. This heat transport is achieved substantially without vibration using, inter alia, a pump having no moving parts, using substantially laminar flow to circulate the liquid metal, and not physically contacting the object to the heat-exchanger. In other embodiments heat-transport capacity can be achieved using a suspension of liquid metal and small particles having appropriate thermal properties, such as higher heat capacity than liquid metal or a phase change within the operating temperature range of the object. Applications include, but are not limited to, cooling of mirrors and/or stages in high heat-flux optical systems and other precision systems.

The heat exchanger is any of various devices that receive heat from the liquid, circulating in the conduit circuit in the component, across a gap between the heat-exchanger and the object. The gap is occupied by a suitable gas (desirably a flowing gas) that conducts heat from the liquid to the heat-exchanger. Thus, the heat-exchanger effectively serves as a heat sink for removing heat from the circulating liquid.

An embodiment of a thermally regulated component comprises first and second heat-transfer zones. The first heat-transfer zone includes a first component surface that receives a heating influence such as high-intensity incident electromagnetic radiation. The second heat-transfer zone includes a second component surface at which heat is removed from the component. The conduit circuit extends in the component through the first heat-transfer zone, continues in the component through the second heat-transfer zone, and returns to the first heat-transfer zone. The conduit circuit contains an electrically conductive liquid, desirably a "liquid metal." Flow of the liquid in the conduit circuit is induced by a substantially vibration-free pump coupled to the circuit. The conduit circuit with circulating liquid provides an efficient heat-transport medium in the component without introducing vibration to the component. A heat-exchanger is situated in thermal contact with, but not in actual contact with, the second component surface such that heat, delivered to the second heat-transfer zone by the electrically conductive liquid flowing in the conduit circuit, flows from the second component surface to the heat-exchanger. With this embodiment, as the heating influence heats the component in the first heat-transfer zone, the liquid flowing in the conduit circuit absorbs heat in the first heat-transfer zone and delivers the heat to the second heat-transfer zone, in which zone the heat is transferred from the liquid to the heat-exchanger.

The first component surface desirably is separated from the conduit in the first heat-transfer zone by a thin plate that can be made of the material of the component or other suitable material. Similarly, in the second heat-transfer zone the conduit circuit desirably is separated from the second component surface by a thin plate that can be of the material of the component or other suitable material.

The heat-exchanger desirably is separated from the second component surface by a defined gap occupied by a thermally conductive fluid (desirably a flowing gas) that facilitates conduction of heat from the second component surface across the gap to the heat-exchanger. An advantage of the gap is prevention of vibration-transmission from, for example, the heat-exchanger to the component while still facilitating efficient heat removal from the second component surface to the heat-exchanger.

The gap can be "planar," in which the gap is situated between a substantially planar surface of the heat-exchanger and a substantially planar second component surface. In other embodiments the gap is situated between respective surfaces of the heat-exchanger and second component surface that are mutually convoluted (e.g., interdigitated) with each other to increase respective areas of the surfaces compared to otherwise similar planar surfaces. The mutually convoluted surfaces increase the rate of thermal transfer from one surface to the other compared to non-convoluted. The convolutions can have sufficient space between them to allow for a small amount of relative movement of the component and heat-exchanger. In yet other embodiments the gap can be bounded by a labyrinth seal to improve containment of gas flow within the gap. Another way in which to improve containment of gas flow in the gap is to bound the gap with at least one differential pumping groove. Yet another way in which to improve containment of gas flow in the gap is to bound the gap, at least in part, by at least one proximity seal. The proximity seal can be an "active" seal, wherein at least one part of the seal can be actuated to increase or decrease the degree of seal.

By using an electrically conductive liquid (especially liquid metal), a pump can be used that has no moving parts, such as a magneto-fluid-dynamics (MFD) pump, that can run on DC power and produce substantially no vibrations. Alternatively, magnetic induction pumps utilizing AC power can also provide low vibration flow of a conducting fluid. The pump can be situated, at least in part, inside the component (in the component "body") where the pump can be connected directly in series to the conduit circuit that also is situated, at least in part, inside the component.

Electrical conductors (e.g., wires) delivering electrical current to the pump from a separate source need not actually contact the pump or the component. For example, each wire can include a respective liquid-metal connection comprising a well containing liquid metal and the conductor contacting the liquid metal but not the well. Thus, vibration transmissions to and from the pump are greatly inhibited and/or attenuated.

An example component is configured as a movable member of a stage, such as a reticle stage in an EUV microlithography system. In a stage, the movable member can comprise first and second member portions, wherein the conduit circuit can be in both the first and second member portions. For example, the first heat-transfer zone can be associated with the first member portion, while the second heat-transfer zone is associated with the second member portion. In some embodiments the heat-exchanger is or comprises a longitudinally extended body, wherein the second heat-transfer zone includes fluid bearing associated at least with the second member portion and is configured to move, with the first and second member portions, relative to the longitudinally extended body. By way of example, the longitudinally extended body can be a guide (e.g., a guide bar) defining a direction of motion of the movable member. The longitudinally extended body can be actively cooled. The fluid bearing also includes the gap containing the thermally conductive fluid between the bearing and the longitudinally extended body. Heat is conducted by the thermally conductive fluid from the second heat-transfer portion across the gap to the longitudinally extended body.

In some embodiments the heat-exchanger includes a heat-exchanger body and a second conduit circuit. The heat-exchanger body has third and fourth heat-transfer zones. The second conduit circuit (also containing an electrically conductive liquid such as liquid metal) extends in the body through the third heat-transfer zone, continues in the body through the fourth heat-transfer zone, and returns to the third heat-transfer zone. Flow of the electrically conductive liquid through the second conduit circuit desirably is achieved using a vibration-free pump, in coordination with the flow of the liquid through the first conduit circuit.

The pump desirably runs on DC power, which produces less and lower-magnitude vibrations than AC-powered pumps. The DC power in some embodiments is produced by an "on-board" (i.e., carried by the component itself) DC power source to reduce wiring to and from the component. Maintaining the output of the DC power source can be achieved by periodically charging it. An exemplary charging circuit includes an on-board inductor connected to the power source and an off-board AC-signal source to which the inductor can be inductively coupled. In certain embodiments, for example, the external AC signal source comprises a transformer including a ferromagnetic yoke relative to which the on-board inductor can be inductively coupled. In other embodiments the external AC signal source comprises an array of magnets of alternating polarity positioned relative to the on-board inductor to excite the on-board inductor whenever the on-board inductor moves relative to the magnet array. Interaction of the on-board inductor with the external AC signal source desirably is selected for particular moments during operation. For example, charging can be achieved when the thermally regulated component is in a certain position or when the thermally regulated component is accelerating or decelerating.

An example component is configured as a movable reticle chuck mounted to a reticle stage. A particularly effective use of such a chuck and stage is the holding and positioning of a reticle that is vulnerable to heating during use. A particular type of reticle in this regard is a reflective reticle used for EUV microlithography. The reticle stage can include, for example, a fine stage and a coarse stage, wherein the fine stage is movable relative to the coarse stage. The fine stage can include a reticle chuck through which the conduit circuit extends, and the heat-exchanger can be associated with the coarse stage.

Another aspect of the invention pertains to reflective optical elements that, when irradiated by certain type(s) of radiation (especially radiation with which they are normally used), experience heating. An embodiment of such an element has a first body having a first surface and a second surface, wherein the first surface is vulnerable to heating. A conduit circuit comprising a first conduit portion extends in the first body adjacent, but separated by a defined distance of the first body from, the first surface. A second portion of the conduit extends in the first body adjacent, but separated by a defined distance of the first body from, the second surface. The conduit circuit contains a liquid metal in a condition in which the liquid metal can flow in the conduit circuit. A substantially vibration-free pump is coupled to the conduit circuit. The pump induces flow of the liquid metal through the conduit circuit, from the first conduit portion to the second conduit portion and from the second conduit portion to the first conduit portion. A heat exchanger is situated adjacent, but without contacting, the second surface. Thus, heat delivered to the second surface from the first surface by flow of the liquid metal in the conduit circuit conducts from the second surface to the heat-exchanger.

The optical element can include a second body that comprises a radiation-incidence surface and a mounting surface. The mounting surface is mounted to the first surface of the first body. Meanwhile, as the radiation-incidence surface receives incident electromagnetic radiation, at least a portion of the radiation is absorbed by the second body, causing heating of the second body and thus of the first surface.

Another aspect of the invention pertains to optical systems that include a support and an optical element as summarized above.

Yet another aspect of the invention pertains to stages, of which an exemplary embodiment includes a movable body having first and second surfaces. A conduit circuit comprising a first conduit portion extends in the body adjacent, but separated by a defined distance of the body from, the first surface (which is vulnerable to heating). A second portion of the conduit extends in the body adjacent, but separated by a defined distance of the body from, the second surface. Liquid metal is contained and flows in the conduit circuit. A substantially vibration-free pump is mounted at least partially in the body. Coupled to the conduit circuit, the pump induces circulatory flow of the liquid metal through the conduit circuit. A heat exchanger is arranged in thermal contact with, but not contacting the second surface. The stage can be used in, for example, a precision system that includes a frame to which the stage is mounted.

Yet another aspect of the invention is directed to methods for cooling an object having first and second surfaces, wherein the first surface is subject to an external heating influence. An embodiment of the method includes flowing an electrically conductive liquid in a first path in the object that is adjacent, but separated by a first distance from, the first surface to allow the liquid in the first path to absorb heat conducted by the object across the first distance from the first surface. The electrically conductive fluid also is flowed from the first path to a second path that is adjacent, but separated by a second distance from, the second surface to allow the liquid in the second path to conduct heat across the second distance to the second surface. As the heat is conducted to the second surface, at least a portion of the heat from the second surface is conducted across a gap to a heat exchanger, without contacting the heat exchanger to the object, to remove heat from the second surface. Flow of the electrically conductive fluid is advantageously achieved using a substantially vibration-free pump. The pump can be powered from an on-board power source. Without contacting the object, the on-board power source can be charged as required to maintain an ability of the power source to power the pump. The charging step can include connecting an inductor to the on-board power source, and inductively coupling the inductor to a remote charging circuit without contacting inductor to the remote circuit.

Yet another aspect of the invention pertains to lithography systems, of which an embodiment comprises a frame, an optical system mounted to the frame, and a stage. The optical system includes at least one optical component. The stage is mounted to the frame and comprises a stage platform situated relative to the optical system. At least one of the optical component and stage platform is a thermally regulated component as summarized above. For example, the thermally regulated component can be a reflective optical element (e.g., a reticle or other pattern master) irradiated with a beam of extreme-UV radiation, wherein the stage platform is thermally regulated, and the stage platform comprises a chuck configured to hold the reflective optical element on the stage platform.

A further aspect of the invention pertains to devices for cooling a component. An embodiment of such a device comprises a movable body to which the component is mountable. The body has first and second surfaces, wherein the first surface is susceptible to heating. A conduit circuit comprises a first conduit portion extending in the body adjacent, but separated by a defined distance of the body from, the first surface. The conduit circuit also comprising a second conduit portion extending in the body adjacent, but separated by a defined distance of the body from, the second surface. A liquid metal is contained in the conduit circuit in a condition in which the liquid metal can flow in the conduit circuit. A substantially vibration-free pump is mounted at least partially in the body and coupled to the conduit circuit. The pump is configured to induce flow of the liquid metal through the conduit circuit from the first conduit portion to the second conduit portion and from the second conduit portion to the first conduit portion. The device also includes a heat-exchanger arranged in thermal contact with, but not contacting, the second surface.

The device can include an on-board power supply that is mounted to the movable body, movable with the movable body, and electrically connected to the pump to power the pump. A first inductor can be connected to the on-board power supply and configured to receive inductive energy from an external AC signal source whenever the first inductor is inductively coupled to the external AC signal source. This inductive energy is used for charging the on-board power supply. The external AC signal source can include a second inductor relative to which the first inductor can be inductively coupled as needed to receive electrical energy from the external AC signal source via the second inductor. Meanwhile, the movable body can be selectively positionable to couple the first inductor to the second inductor at selected times during motion of the movable body. By way of example, the external AC signal source can include an array of magnets of alternating polarity positioned relative to the first inductor to excite the first inductor whenever the first inductor moves relative to the magnet array.

Yet another aspect of the invention is directed to devices for powering an apparatus on a movable stage. An embodiment comprises an electrical-power-consuming unit mounted on the stage, and an on-board power supply mounted on the stage and connected to the power-consuming unit. A first inductor is connected to the on-board power supply, and an external AC signal source is situated separately from and without contacting the stage. The first inductor is configured to receive inductive energy from the signal source whenever the first inductor is inductively coupled to the signal source. By using inductive coupling, the on-board power supply can be charged without physically contacting the stage, which provides for substantially reduced transmission of vibrations to the stage. For example, the on-board power supply can comprise a DC power supply to which a first inductor is connected. The first inductor receives inductive energy from an external AC signal source whenever the first inductor is inductively coupled to the external AC signal source. The inductive energy is used for charging the on-board power supply. (The on-board power supply can include a rectifier circuit to convert the received AC inductive energy to DC suitable for recharging a DC power supply.) The external AC signal source can comprise a second inductor relative to which the first inductor can be inductively coupled as needed to receive electrical energy from the external AC signal source via the second inductor. Furthermore, the movable body can be selectively positionable to couple the first inductor to the second inductor at selected times during motion of the movable body. For example, the first and second inductors can be inductively coupled whenever the movable body is at a selected position, is accelerating, or is decelerating.

The foregoing and additional features and advantages of the invention will be more readily apparent from the following detailed description, which proceeds with reference to the accompanying drawings.

DETAILED DESCRIPTION

Figure 1:
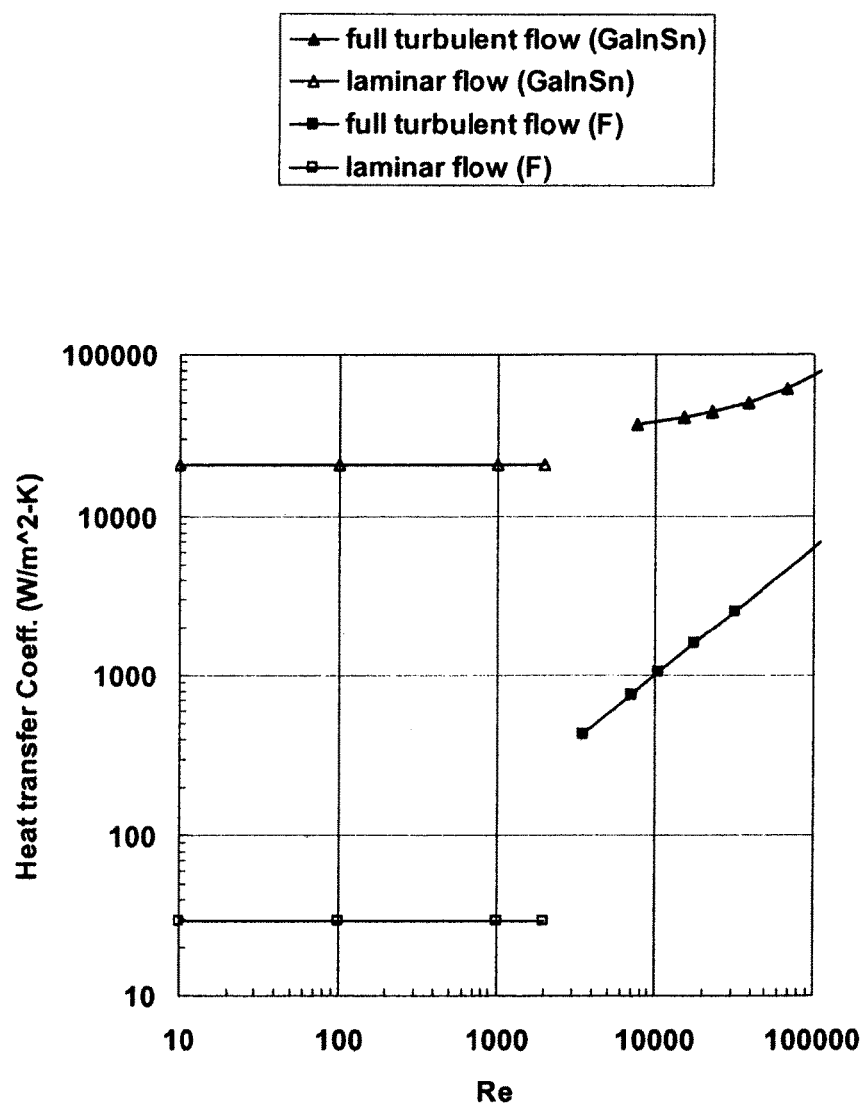
FIG. 1 is a plot of heat-transfer coefficients (W/(m$^2$·K)) as functions of the Reynolds number Re for both Fluorinert® and GaInSn.

The invention is described below in the context of representative embodiments that are not intended to be limiting in any way.

As used in this application and in the claims, the singular forms "a," "an," and "the" include the plural forms unless the context clearly dictates otherwise. Additionally, the term "includes" means "comprises." Further, the term "coupled" encompasses mechanical as well as other practical ways of coupling or linking items together, and does not exclude the presence of intermediate elements between the coupled items.

The things and methods described herein are representative embodiments and should not be construed as being limiting in any way. Instead, this disclosure is directed toward novel and non-obvious features and aspects of the various disclosed embodiments, alone and in various combinations and sub-combinations with one another. The disclosed things and methods are not limited to any specific aspect or feature or combinations thereof, nor do the disclosed things and methods require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed things and methods can be used in conjunction with other things and method. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In the following description, certain terms may be used such as "up," "down,", "upper," "lower," "horizontal," "vertical," "left," "right," and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object.

Various embodiments described below utilize the high heat-transfer rate of liquid metal to transport heat efficiently away from heat-susceptible and vibration-sensitive components. Liquid metal is desirable for this use because of its, inter alia, high thermal conductivity and low specific heat compared to water. Also, being a fluid, liquid metal can be pumped and caused to flow in conduits and channels.

The liquid metal is circulated in a first zone of the component configured to allow the liquid metal to acquire and thus remove heat from the component. The liquid metal is also circulated in a second zone of the component configured to allow the heat acquired by the liquid metal in the first zone to be removed from the liquid metal. Flow in both zones is substantially vibration-free, which can be achieved by limiting flow velocity to a range in which the flow is laminar or otherwise non-turbulent. More specifically, heat is acquired by the liquid metal from the component in the first zone and removed from the liquid metal by a heat exchanger in the second zone. The liquid metal is then returned to the first zone in a substantially continuous cycle. Example applications include, but are not limited to, cooling of mirrors, stages, and chucks (e.g., reticle stages and chucks) in high-heat-flux optical systems, such as EUV microlithography systems, other microlithography systems, and other high-precision systems.

"Liquid metal" is a metal that is liquid at operating temperature such as in the vicinity of room temperature. Mercury (Hg) is an example liquid metal, but unfortunately its use poses substantial toxic and environmental risks. Other practical liquid metals include, but are not limited to, liquid gallium (Ga), GaInSn, GaInSnZn, other GaIn alloys, and SnPbInBi. Aside from their elemental compositions, the available liquid metals differ from each other largely in terms of their respective freezing points. Use of liquid metal for cooling is advantageous for several reasons: (a) Liquid metals have higher thermal conductivity than water and other conventional coolants. The high thermal conductivity allows heat energy to pass efficiently to the liquid metal from a warmer region contacting it, which allows the liquid metal to be circulated at reduced flow-rates to reduce vibration. (b) Liquid metals have high electrical conductivity, which allows certain types of flow-inducing pumps to be used that are efficient, compact, and substantially vibration-free. (c) Most usable liquid metals have very low vapor pressures, even at elevated temperatures (e.g., gallium: $10^{-12}$ Torr at 100° C. and $10^{-11}$ Torr at 300° C.), which is advantageous for their use in vacuum environments. A detriment is that liquid metals have low specific heat, by which is meant that less heat energy is required to increase the temperature of a unit quantity of the liquid metal by a certain temperature interval.

By way of example, gallium has properties as set forth in Table 1, which are compared to respective properties of water:

TABLE 1

| Property | Gallium | Water |
|---|---|---|
| Density (kg/m³ at 40° C.) | 6095 | 990 |
| Melting Point (° C.) | 29.8 | 0.0 |
| Boiling Point (° C. at 1 atm) | 2205.0 | 100.0 |
| Vapor Pressure (Torr at 100° C.) | $10^{-10}$ | 760.0 |
| Thermal Conductivity (W/m · ° C.) | 28.7 | 0.63 |
| Specific Heat (J/kg · ° C.) | 382 | 4180 |
| Viscosity (kg/m · sec at 40° C.) | 0.00203 | 0.00065 |
| Kinetic Viscosity (m²/sec) | $3.3 \times 10^{-7}$ | $1.0 \times 10^{-6}$ |
| Figure of Merit* | $66.7 \times 10^6$ | $2.5 \times 10^6$ |

*(density × specific heat × thermal conductivity)

The "figure of merit" is an indicator of the efficiency of the cooling fluid at low fluid velocity. In this regard, gallium is over 25-times more efficient than water.

Physical properties of GaInSn compared to Fluorinert® FC3283 (3M Company) at 27° C. are listed in Table 2, below. Fluorinert FC3283 is representative of various fluids bearing the Fluorinert trademark, which are used mainly as electronics coolants. They are electrically insulating, highly inert, fluorocarbon-based fluids having different boiling points. Fluorinert FC3283 is also used in vacuum systems for leak detection.

TABLE 2

| Property | Symbol | Unit | Fluorinert | GaInSn |
|---|---|---|---|---|
| Kinematic viscosity | $\eta$ | m²/sec | 7.53 × 10−7 | 3.48 × 10-7 |
| Density | $\rho$ | kg/m³ | $1.82 \times 10^3$ | 6363.2 |
| Dynamic viscosity | $\mu$ | kg/(m · sec) | $1.370 \times 10^{-3}$ | $2.21 \times 10^{-3}$ |
| Specific heat | $c_p$ | J/(kg · K) | $1.20 \times 10^3$ | 365.813 |
| Thermal conductivity | $k_w$ | W/(m · K) | 0.06328 | 39 |
| Prandtl number | Pr | | 25.9712 | $2.08 \times 10^{-2}$ |
| Figure of Merit | | | $0.138 \times 10^6$ | $90.8 \times 10^6$ |
| | $c_p \cdot \rho$ | J/(m³ · K) | 2184000 | 2327741 |

*See Dayananda et al., "Autotrophic cultivation of *Botryococcus braunii* for the production of hydrocarbons and exopolysaccharides in various media"; Biomass Bioenergy 2007, 31, (1), 87-93.

The quantity $c_p \cdot \rho$ is a measure of the amount of heat the fluid can remove at a given volumetric flow rate and temperature change. For example, $c_p \cdot \rho$ is the amount of heat that a unit volume of fluid can absorb for a 1° C. temperature rise. Table 2 shows that Fluorinert and GaInSn have roughly comparable values of $c_p \cdot \rho$, indicating that liquid metal is useful for cooling applications under comparable conditions. This is illustrated in FIG. 1, which is a plot of heat-transfer coefficients (W/(m²·K)) as functions of the Reynolds number Re for both Fluorinert and GaInSn. Plots are shown for both laminar flow and fully turbulent flow. Laminar flow exists whenever the Reynolds number Re of the flow is less than approximately 2000. The Reynolds number is defined as:

$$Re = Dv/\eta \quad (1)$$

where v is the flow velocity, and D is a characteristic size of the flow channel, such as the diameter of a cylindrical tube or the hydraulic diameter if the channel is not cylindrical. These data show that desired cooling capacity can be achieved with liquid metal flowing even under laminar-flow conditions. FIG. 1 also shows that the heat-transfer coefficient for GaInSn is much higher than for Fluorinert.

Figure 2A:
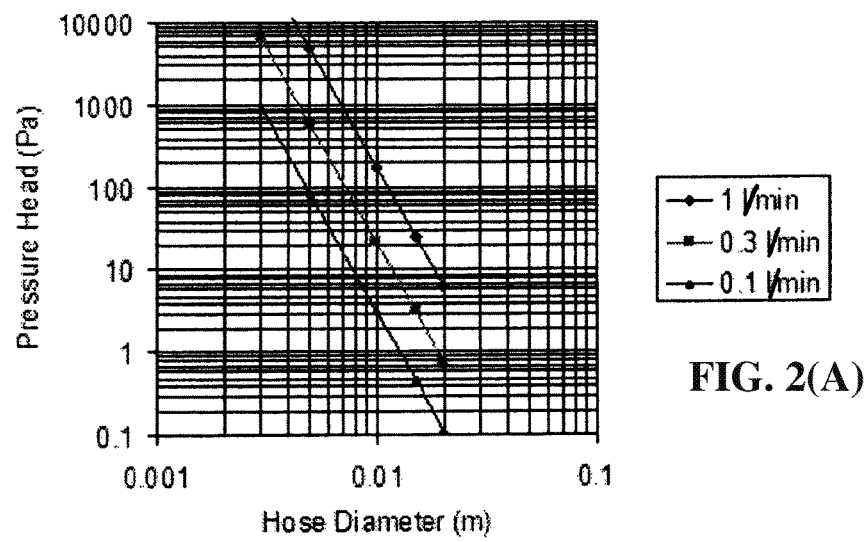
FIG. 2(A) is a plot of the pressure head of GaInSn liquid metal as functions of flow rate and diameter of the conduit channel in which the liquid metal is flowing.
Figure 2B:
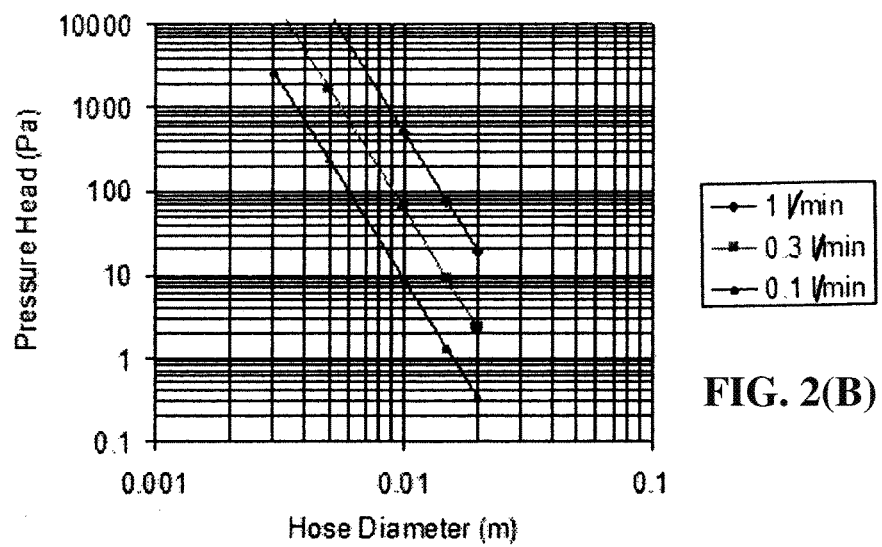
FIG. 2(B) is a plot of the pressure head of Fluorinert® as functions of flow rate and diameter of the conduit channel in which the Fluorinert is flowing.

The viscosity of liquid metal is higher than of Fluorinert. Consequently, for a given flow rate and diameter of coolant channel, the pressure head for liquid metal (e.g., GaInSn; see FIG. 2(A)) is higher than for Fluorinert (FIG. 2(B)). This requires consideration of the pressure against which a pump must operate to propel the liquid metal. Magnetofluid-dynamic (MFD) pumps can operate with pressure heads as high as 45 psi. Reducing the pressure demand on the pump helps reduce vibrations. These data indicate the suitability of liquid metals for the instant cooling applications.

The liquid metal can be used "as-is" or as a suspension in which the liquid metal is a carrier liquid for small particles of a metal(s) or non-metal(s) suspended therein. The particle size can be in the range of microparticles to nanoparticles, and can be uniformly sized or have a size distribution. A suspension of particles in liquid metal can provide higher or more efficient heat capacity or other advantageous thermal property than liquid metal alone. Another alternative is a suspension of particles in an electrically conductive carrier liquid.

Low-vibration circulation is achieved, at least in part, by utilizing a substantially vibration-free pump. The electrical conductivity of liquid metals allows certain pumps to be used that have substantially no moving parts, that operate on direct current power, and that provide substantially constant flow while producing substantially no vibration. One pump having such characteristics is a magnetofluid-dynamic (MFD) pump, which is based on principles of magnetohydrodynamics (MHD). These pumps are available from, for example, Nanocoolers, Inc., Austin Tex.; see also Miner and Ghoshal, *Appl. Phys. Lett.* 85:506-508 (2004). A MFD pump includes a pair of permanent magnets, spaced apart by a small gap for the liquid metal to pass through, that creates a high magnetic-field region in the liquid-metal fluid stream. Direct-current power (generally low-voltage, high current) is applied across the fluid stream within the magnetic field using electrodes connected to a source of dc power. The resulting electric field is perpendicular to both the flow direction and the magnetic field. As a result, the electrically conductive liquid metal experiences a net force (basically a Hall-effect force) that induces flow of the liquid in the flow direction without using any moving parts. To ensure substantially vibration-free pumping, the flow-rate of coolant established by the pump desirably is as low, and thus as gentle, as practicable for achieving the desired rate of heat removal. Desirably, the flow-rate is in a range in which the coolant flows in a laminar or otherwise substantially non-turbulent manner. Vibration-free pumping is also facilitated by the fact that the pump is operated with dc power and has no moving parts.

Figure 6:
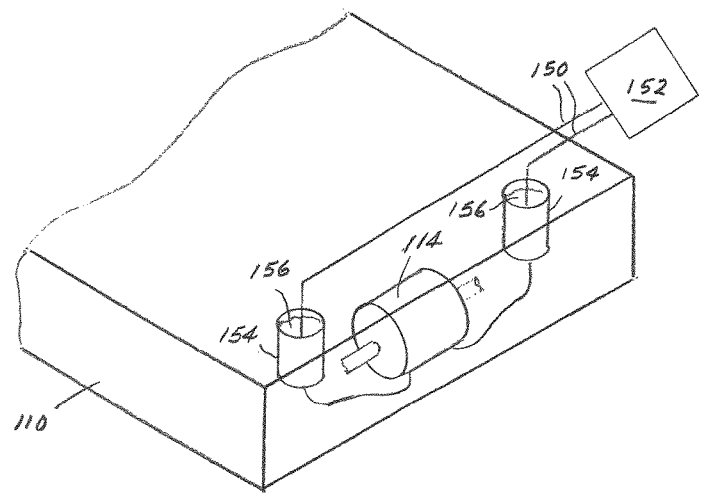
FIG. 6 is an isometric schematic view of an exemplary manner of supplying electrical power to an MFD pump, as an example pump for liquid metal, using wires that connect to the pump with substantially no vibration transmission to the pump or component via the wires.

Wires connected directly to the electrodes and to the dc source can transmit vibrations to the pump and/or component, so the connections between the wires and the respective electrodes can be made across, for example, respective liquid metal junctions (FIG. 6). To such end, for example, the two electrical leads from the motor terminate on the surface of the component in respective wells each containing a small amount of liquid metal. Respective wires from the dc source are inserted into the respective wells to contact the liquid metal without contacting the component.

Another pump is discussed in Smither et al., *Nucl. Instrum. Meth. Phys. Res. A*266:517-524 (1988), which is an electromagnetic induction pump similar to a liquid-sodium pump used in nuclear reactors. This reference, particularly pages 522-523 thereof, is incorporated herein by reference. This pump is further described in U.S. Pat. No. 5,209,646, incorporated herein by reference.

Another type of induction pump utilizes AC magnetic fields to induce electrical currents in a conducting fluid. The currents interact with the magnetic fields to produce a force on the fluid. By using multiple electrical phases, such as 3-phase, approximately constant forces can be applied to the fluid.

The various embodiments can include a stationary component, such as a mirror in an optical system, or a moving component that is cooled. "In motion" encompasses accelerating, decelerating, and moving at constant velocity. For example, certain embodiments operate well even when being accelerated and decelerated at 8 g or more, where g is the acceleration of earth's gravity at sea level, g~9.8 m/sec$^2$. Conventional liquid-cooling systems are generally unsuitable for use with moving components because of the systems' susceptibility to sloshing, vibrations, and general instability when experiencing motion.

In certain alternative embodiments, a non-metallic, electrically conductive liquid is used instead of liquid metal. An example alternative liquid is salt water (sodium chloride solution). This liquid can be used "as-is" or including, in suspension, particles of a substance having appropriate thermal properties, such as particles of a metal or non-metal. A key reason this alternative liquid is usable is its electrical conductivity, which allows the liquid to be pumped using an MFD or analogous type of pump. The particles are generally in the range of micro- to nano-sized particles.

First Representative Embodiment

Figure 3:
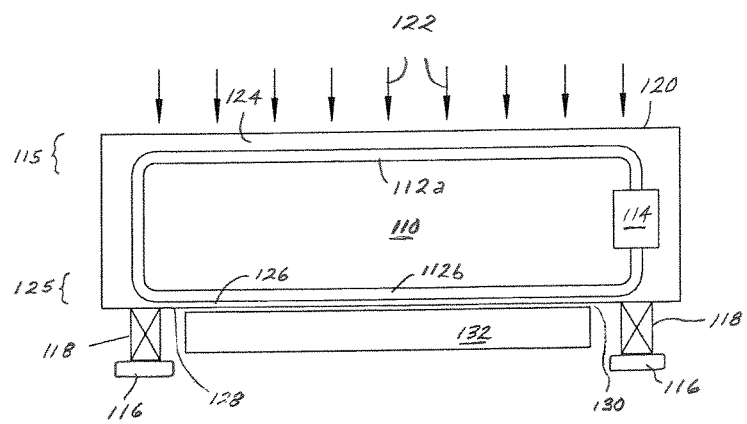
FIG. 3 is a schematic diagram of a thermally regulated component, according to the first embodiment.

This embodiment is shown in FIG. 3, which depicts a component 110 (e.g., a mirror, stage, or chuck) with an integral fluidic circuit 112 and a coolant pump 114 connected to the circuit. The component 110 in this embodiment is stationary, being mounted to a frame 116 by vibration-isolation or vibration-attenuating mounts 118 that inhibit transmission of vibrations from the frame to the component. The component 110 includes a first surface 120 (e.g., a stage platform) that receives heat 122 (indicated by arrows) from, e.g., incident high-intensity radiation. The fluidic circuit 112 extends in the component 110. A first conduit portion 112a of the circuit 112 is situated below, and separated by a small distance 124 from, the first surface 120. This region of the component 110 including the first surface 120, the distance 124, and the first conduit portion 112a can be termed a "first heat-transfer zone" 115. The distance 124 is essentially occupied by a respective portion of the mass of the component 110 or by a separate partition piece (not necessarily of the same material as the component) bonded or otherwise sealed to the component. The partition piece can be disc-shaped, for example. A second conduit portion 112b of the circuit 112 extends above, and separated by a small distance 126 from, a second surface 128. This region of the component 110 including the second surface 128, the distance 126, and the second conduit portion 112a can be termed a "second heat-transfer zone" 125. The distance 126 is essentially occupied by a respective portion of the mass of the component 110 or by a separate partition piece (not necessarily of the same material as the component) bonded or otherwise sealed to the component. The piece can be disc-shaped, for example. Adjacent the second surface 128, but separated therefrom by a narrow gap 130, is a heat-exchanger 132. The gap 130 is gas-filled to facilitate conduction of heat across it. The pump 114 is connected to the conduit portions 112a, 112b, thereby forming a complete fluidic circuit 112 for the liquid metal. The pump 114 induces flow of liquid coolant through the conduit portions 112a, 112b in a substantially vibration-free manner.

The pump 114 in this embodiment is internal and is configured as an MFD pump. As discussed above, an MFD pump 114 includes a fluid passageway of which the axis is orthogonal to orthogonally crossing magnetic and electric fields produced by the pump. The magnetic field is produced by permanent magnets, having the same orientation, being situated adjacent but outside and on opposite sides of the fluid passageway to produce a strong transverse magnetic field. Thus, the magnetic field is produced without having to use anything that actually contacts the fluid passageway or the component 110. The electric field is produced by opposing electrodes that are situated in the fluid passageway of the pump and thus contact the liquid metal in the fluid passageway. The electrodes are connected to a source of dc power.

As the first surface 120 absorbs heat 122 from incident radiation and/or other sources, the heat is conducted across the distance 124 to the liquid metal flowing in the first conduit portion 112a. Thus, the liquid metal absorbs heat from the component in the first heat-transfer zone 115. The liquid metal then passes through the second conduit portion 112b, where the absorbed heat is conducted across the distance 126 and across the gas-filled gap 130 to the heat-exchanger 132. Thus, in the second heat-transfer zone 125 the liquid metal loses heat to the heat-exchanger 132. The liquid metal then returns to the pump 114, which induces flow of the liquid metal back to the first heat-transfer zone 115.

The first conduit portion 112a routes the liquid metal in a manner that achieves a desired temperature distribution across the first surface 120. Depending upon the application and prevailing conditions, the first conduit portion 112a can be configured to provide a series flow of liquid metal, a parallel flow of liquid metal (e.g., multiple parallel channels branching from a plenum), or a combination of series and parallel flow. See, for example, U.S. patent application Ser. No. 12/001,529, filed on Dec. 11, 2007, incorporated herein by reference in its entirety. Series flow can be achieved by configuring the first conduit portion 112a in a serpentine manner, for example.

The first conduit portion 112a can include microchannels as described, for example, in US Patent Publication No. US 2007/0091485, incorporated herein by reference in its entirety. For example, microchannels can be arrayed in a radial manner around a substantially central feed port or exhaust port. The microchannels alternatively can be arranged to receive the coolant from feed grooves that, in turn, are supplied through an inlet port.

The first conduit portion 112a can be "customized" to provide any desired pattern of flow. For example, the first conduit portion 112a can be configured to provide a uniform rate of heat removal across the entire first surface 120, or configured to achieve a different rate of heat removal in one region of the first surface 120 versus another region so as, for example, to achieve local cooling profiles that offset a differential rate of heating in one location of the first surface 120 versus another. An example of the latter is a first conduit portion 112a that concentrates cooling efficiency at the middle of the first surface 120 (to remove a greater amount of heat 122 being concentrated in the center of the first surface), compared to the periphery of the first surface. This discussion regarding the first conduit portion 112a is also applicable to the second conduit portion 112b. The conduit portions 112a, 112b need not be configured in the same manner.

In FIG. 3 the second heat-transfer zone 125 is shown on the side opposite the first heat-transfer zone 115. However, in an alternative configuration, the second heat-transfer zone can be located at the right or left side of the component 110, or on the side facing out of the page or the obverse side.

As noted, the distance 124 is essentially occupied by a respective portion of the mass of the component 110 or by a partition piece situated between the first surface 120 and the first conduit portion 112a. Practical ranges for the distance 124 depend upon various factors including, but not limited to, the material of the component, the area of the surface 120 above the first conduit portion 112a, the conduit dimensions, the configuration of the first conduit portion 112a, and the pressure and flow rate of liquid metal through the first conduit portion 112a. By way of example, the distance 124 can be in the range of 1 to 10 mm. Similarly, the distance 126 is essentially occupied by a respective portion of the component 110 (or separate partition piece) situated between the second conduit portion 112b and the second surface 128. Practical ranges for the distance 126 are as noted for the distance 124.

The respective portion of the component 110 or separate piece defining the distance 124 is shown as being planar, which can provide a substantially uniform thickness dimension between the surface 120 and the conduit portion 112a. But, this is not intended to be limiting. For example, a component 110 configured as a collimator or condenser mirror typically has a concave upper surface 120, which could provide a lesser distance 124 in a middle region of the surface 120 compared to a peripheral region of the surface. To offset the effect of the resulting variation in the distance 124, the conduit portion 112a may include microchannels or the like arranged to provide more cooling in the middle region of the surface 120 compared to the peripheral regions of the surface, or vice versa.

Similarly, the respective portion of the component 110 or separate piece defining the distance 126 is shown as being planar, which can provide a substantially uniform thickness dimension between the lower surface 128 and the conduit portion 112a. But, this is not intended to be limiting. For example, the lower surface can be non-planar or even have curvature, which could provide a correspondingly variable distance 126 in one region of the surface 128 compared to another region of the surface. To offset the effect of the resulting variation in the distance 126, the conduit portion 112b may be arranged to provide more coolant flow adjacent one region of the surface 128 compared to another region.

The conduit portions 112a, 112b can be formed using any of various techniques, including (but not limited to) boring or otherwise machining into the mass of the component 110, casting the component in a manner that includes formation of the channels, and milling corresponding channels in respective surfaces of the component followed by hermetic attachment of respective pieces (e.g., cover plates) to the milled surfaces to enclose the channels in a manner that converts the channels into conduits.

The heat-exchanger 132 receives heat conducted across the gap 130 from the component 110. The heat-exchanger 132 can include a thermally conductive mass that serves as a heat-sink for thermal energy intended to pass across the distance 126 and gap 130. The heat-exchanger 132 can be made of any of various rigid materials, depending upon the application. Example materials include any of various metals exhibiting high thermal conductivity. Exemplary materials include, but are not limited to, steel, aluminum, copper, and beryllium, and any of various alloys of these. The shape of the heat exchanger 132 desirably, but not necessarily, conforms approximately to the shape of the second surface 128 or to the plan profile of the second conduit portions 112b. The heat-exchanger 132 can be actively cooled electronically or by its own fluidic circuit (not shown) of liquid or other fluid coolant. The coolant used with the heat-exchanger 132 need not be liquid metal, but it can be, and need not be electrically conductive (but it can be).

The flow-rate of liquid metal in the conduit portions 112a, 112b, as produced by the pump 114, can be selected to avoid or reduce turbulence in the liquid metal flowing in the fluidic circuit 112. Laminar flow generates substantially no vibrations, but is less efficient in thermal transfer than turbulent flow. Turbulent flow may generate vibrations but is more efficient in thermal transfer. Due to the high thermal-transfer efficiency of liquid metal, the flow-rate can be reduced, even to laminar-flow conditions, while still achieving rates of heat removal from the component 110 that are substantially greater than would be otherwise obtained using conventional liquid coolants.

Figure 4:
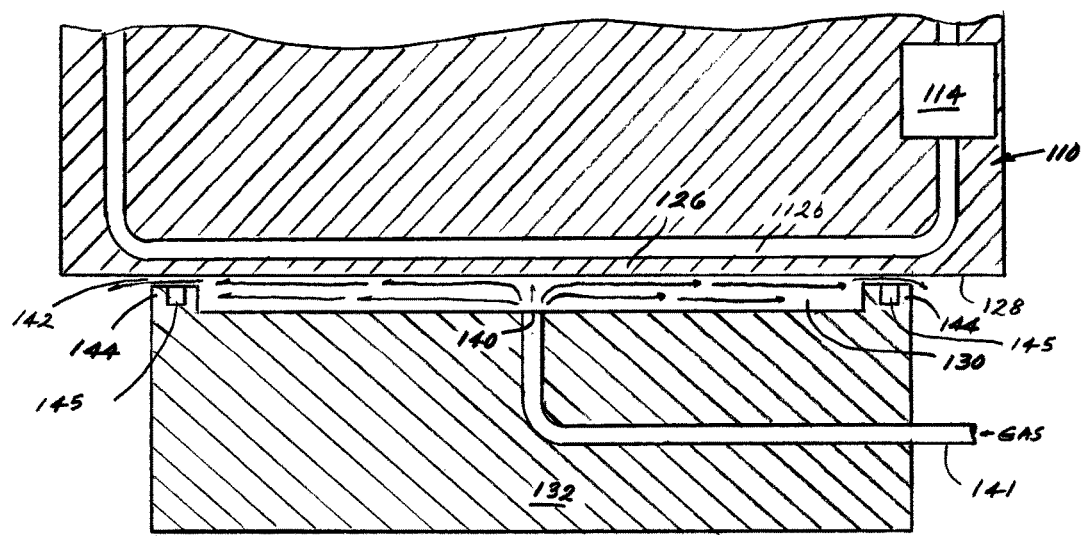
FIG. 4 shows introduction of a flow of gas into a gap between the component and the heat exchanger in the embodiment of FIG. 3.

The gap 130 is occupied by a thermally conductive fluid. Desirably the fluid is a gas, as described in U.S. patent application Ser. No. 12/001,529, filed on Dec. 11, 2007, and incorporated herein by reference in its entirety. Example gases include, but are not limited to, air, argon, helium, and nitrogen, and mixtures thereof. The gas may be contained within the gap by flexible seals, or a narrow gap, providing mechanical isolation between the component 110 and the heat-exchanger 132. Gas leakage through the narrow gap may require a supply of flowing gas to maintain a constant pressure. Since the primary heat-transfer process is conduction through the gas, the flowing of the gas is immaterial to the heat-transfer process. So long as the heat-exchanger surface facing the gap 130 has a lower temperature than the surface 128, and as long as the gap 130 is narrow, heat delivered to the lower surface 128 by the second conduit portion 112b is conducted by the gas across the gap 130 to the heat-exchanger 132. The gap 130 desirably is sufficiently narrow to provide adequate thermal transfer even with gas pressures that are substantially less than atmospheric. This thermal transfer can be substantial. For a gap occupied by gas, an exemplary thickness dimension (vertical dimension in the figure) of the gap 130 is in the range of 0.001 to 0.1 mm. In FIG. 4 gas is introduced into the gap 130 via one or more inlet ports 140 connected to a gas conduit 141. In the figure the inlet port 140 is situated substantially centrally so that flow of discharged gas radiates outward and flows in substantially equal path lengths between the surface 128 and the upper surface of the heat-exchanger 132.

Release of the gas into the surrounding environment can be limited by providing a proximity-seal gap 142 defined between the upper surface of a land 144 and the lower surface 128 of the component 110, wherein the land 144 and lower surface 128 comprise a proximity seal. During use, the gap 142 usually is a few micrometers at most. In addition or alternatively, the gas can be scavenged using one or more differential pumping grooves 145, as disclosed in U.S. Pat. No. 6,628,503, for example. (The '503 patent is incorporated herein by reference.) Limiting escape of the gas into the surrounding environment may be desirable if the surrounding environment is a sub-atmospheric-pressure ("vacuum") environment.

As noted, as an alternative to flowing gas, the gap 130 can be occupied by a thermally conductive liquid. An exemplary liquid is liquid metal, but any of various other liquids can be used, such as but not limited to water or Fluorinert®. Since the liquid is serving simply as a thermal-conductivity bridge between the component 110 and heat-exchanger 132, the liquid need not be flowing, but it can be. A liquid-filled gap, while effective for thermal transfer, may not be as vibration-free as a gap occupied by flowing gas. On the other hand, a liquid metal filling the gap 130 does not require scavenging, and liquid metals have extremely low vapor pressures, both of which are advantageous for use in a vacuum environment.

Referring now to FIG. 6, electrical power can be supplied to the pump 114 by wires 150 from a current source 152. Wires are potential conduits for vibrations imparted by them to the component 110. To avoid this vibration transmission, the connections of the wires to the pump can be made using liquid metal junctions, each comprising a well 154 or analogous cavity containing liquid metal 156. The wells 154 are electrically connected to the pump 114, and the wires 150 are partly immersed in the liquid metal 156 in the wells without actually touching the walls of the wells, thereby forming vibration-free connections from the source 152 to the pump 114.

Second Representative Embodiment

In this embodiment, the component is a movable body, e.g., a movable stage with attached chuck (which collectively can be regarded as a movable "platform"). The chuck moves with the stage, and the stage is movable relative to a heat-transfer region, as discussed in U.S. Pat. No. 7,548,303, incorporated herein by reference in its entirety. The heat-transfer region includes a surface cooled by a stage environmental system (e.g., a system that provides a stream of temperature-controlled liquid for cooling purposes). Between the stage and the heat-transfer region is a fluid-filled gap (e.g., gas-filled). So long as the heat-transfer region has a lower temperature than the surface of the stage facing the gap, heat will conduct from the stage across the fluid-filled gap to the heat-transfer region.

Figure 5B:
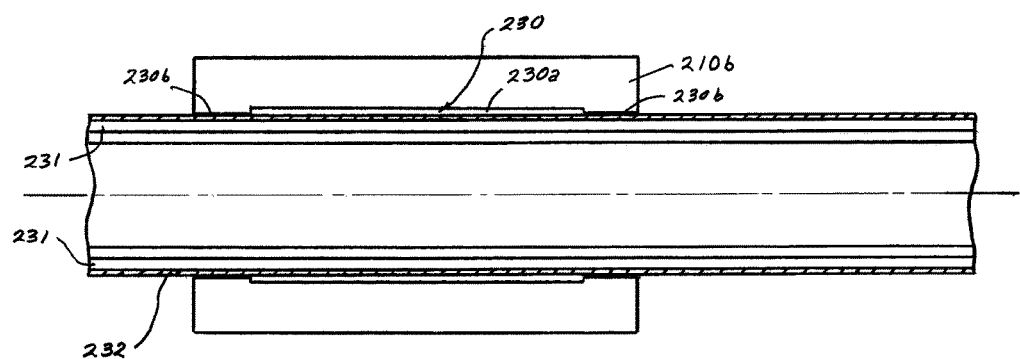
FIGS. 5(A) and 5(B) are respective schematic orthogonal views of a thermally regulated component, according to the second embodiment.
Figure 5A:
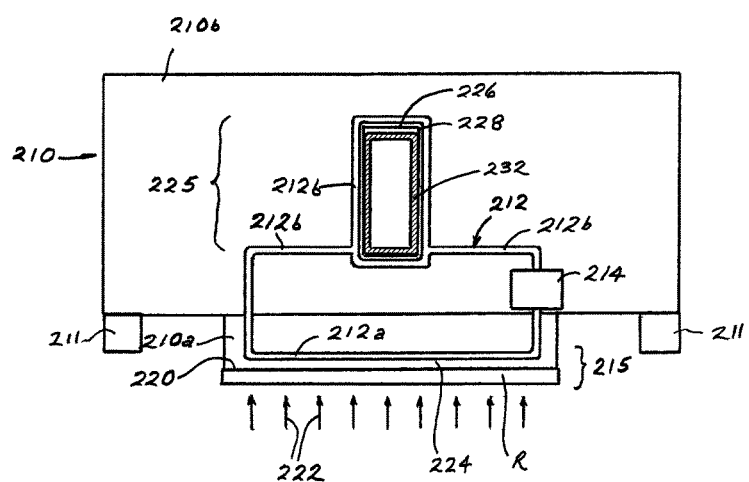

This embodiment is shown in FIGS. 5(A) and 5(B). The component 210 comprises a chuck 210a and a stage 210b to which the chuck is mounted. The chuck 210a and stage 210b move together. In this embodiment a reticle R is mounted to the chuck 210a in a face-down manner characteristic of EUV lithography systems. Hence, the component 210 of this embodiment is a reticle stage with reticle chuck. An integral fluidic circuit 212 includes first conduit portions 212a extending in the chuck 210a, and second conduit portions 212b extending in the stage 210b. A pump 214 on or in the stage 210b is connected to the conduit portions 212a, 212b and induces vibration-free flow of liquid metal through the conduit portions. The chuck 210a includes a first surface 220 that receives heat 222 (indicated by arrows) from, e.g., incident high-intensity radiation. The first conduit portion 212a extends adjacently above, and is separated by a small distance 224 from, the first surface 220. This region of the chuck 210a including the first surface 220, the distance 224, and the first conduit portion 212a can be termed a "first heat-transfer zone" 215. The distance 224 is essentially occupied by a respective portion of the mass of the chuck 210a. The second conduit portion 212b extends to and from, and is separated by a small distance 226 from, a second surface 228. The second surface 228 substantially surrounds a temperature-controlled guide 232, extending in and out of the plane of the page of FIG. 5(A).

The guide 232 can be part of a gas bearing that guides movement of the stage 210b in and out of the plane of the page in FIG. 5(A), wherein the movement is achieved by one or more actuators 211. This region of the stage 210b including the second surface 228, the distance 226, and the second conduit portion 212b of the fluidic circuit can be termed a "second heat-transfer zone" 225. The distance 226 is essentially occupied by a respective portion of the mass of the stage 210b. Adjacent the second surface 228, but separated therefrom by a narrow gap 230, is the guide 232 (see FIG. 5(B)). The gap 230 includes a relieved area 230a and fluid-bearing pads 230b. The relieved area 230a is occupied by gas (or other suitable fluid) and extends around the guide 232. Thus, the stage 210b slides on fluid bearings to the left and right in FIG. 5(B) relative to the guide 232.

The pump 214 is connected to the conduit portions 212a, 212b to form the fluidic circuit for the liquid metal in the conduit portions. The pump 214 induces flow of the liquid metal through the conduit portions 212a, 212b in a substantially vibration-free manner.

The gas in the gap 230 serves several functions. First, it serves as a heat-transfer medium for conduction of heat, via the gas in the gap, from the second surface 228 to the guide 232 without the second surface 228 actually contacting the guide 232. Second, as noted above, the gas can serve as a gas bearing for motions of the stage 210b relative to the guide 232. (The gap 230 and guide 232 need not be used for supporting and guiding movement of the stage; in other embodiments one or more additional guides and respective bearings, or mechanical or magnetic bearings, can be provided for support and motion-guidance purposes, relegating use of the guide 232 and gap 230 for heat-transfer only.)

The guide 232 desirably is actively cooled by suitable means such as electronically or by passing a temperature-controlled coolant through conduits 231 extending in least a portion of the interior of the guide (FIG. 5(B)). Thus, heat is conducted from the second surface 228 across the gas in the gap 230 to the guide 232. Meanwhile, the gas-filled gap 230 avoids any significant friction between the stage 210b and guide 232. The gap 230 also can be sufficiently wide to allow controlled fine motions of the stage 210b up and down and/or left and right in the plane of the page of FIG. 5(A).

The pump 214 can be supplied with electrical current by wires connected to it. For example, if the pump 214 is an MFD pump, a current source must be connected to the electrodes in the pump. If the wires are directly connected to the pump 214, vibrations could pass from the wires to the stage 210b. However, the wires can impose a slight drag on the stage 210b during stage motion. To eliminate wires extending to the stage 210b, an on-board current source can be incorporated into the stage in the form of a battery or capacitor that moves with the stage.

Figure 14:
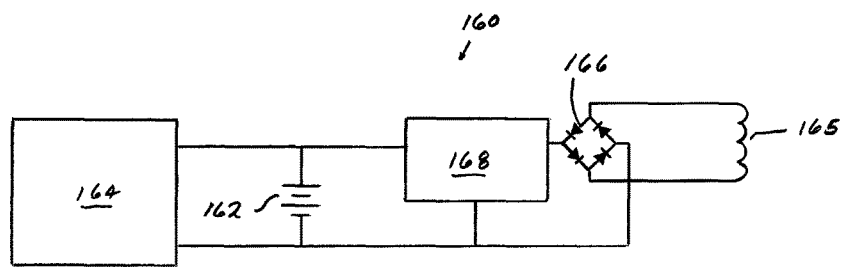
FIG. 14 is a schematic diagram of an embodiment of a device and method for charging a power source located on the fine stage, without having to connect wires to the fine stage.

An on-board current source would need periodic recharging since repeated replacement of the source would be impractical. Periodic recharging can be performed between exposures performed with the lithography system of which the stage is a part. Recharging of the on-stage current source can be done without wires by inductive coupling to the stage using a transformer, along with suitable rectification and filtering for the source to be an on-board dc source. An embodiment 160 is shown in FIG. 14, in which the on-board dc source 162 is a battery that powers an MFD pump 164. An inductor 165 is excited by an external ac signal (not shown) applied to it. Current from the inductor 165 is rectified by a diode bridge 166. A voltage regulator 168 regulates the voltage produced by the circuit to an appropriate level for the battery 162.

Figure 15A:
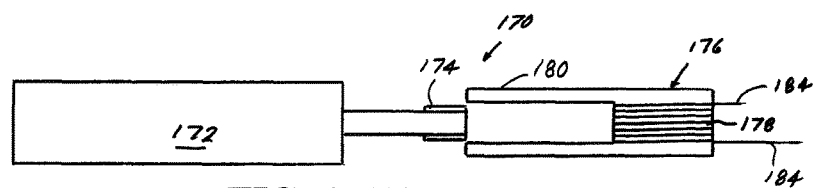
FIGS. 15(A)-15(C) depict another embodiment of a device and method for charging a power source on the fine stage during motions of the fine stage, wherein charging is performed without the need for wires connected to the power source from a location not on the fine stage.
Figure 15B:
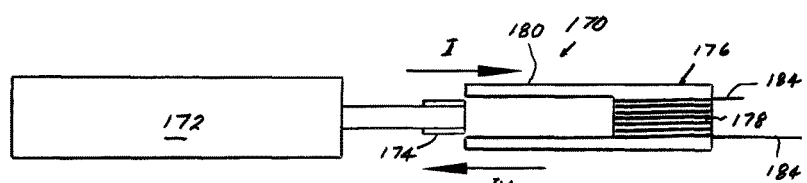
Figure 15C:
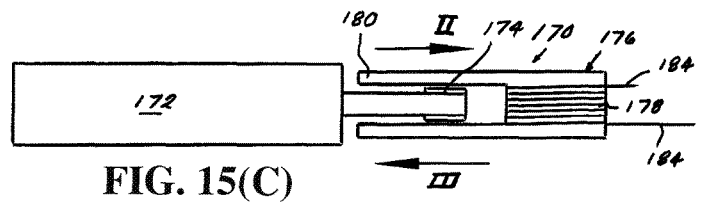

Recharging can be performed, for example, during acceleration and deceleration of the stage when the requirements for precise stage motions are less demanding. Recharging performed at other times using an external ac signal might introduce an undesirable force on the stage through magnetic interaction with ferromagnetic components of the stage or by means of eddy currents. An embodiment of a device 170 for performing charging during accelerations and decelerations is shown in FIGS. 15(A)-15(C). Shown in FIG. 15(A) are a stage 172, an inductor coil 174, and a transformer 176. The transformer 176 includes a primary coil 178 and ferromagnetic yoke 180. The primary coil 178 is connected by leads 184 to electrical current. Whenever the primary coil 178 is being energized in this manner, the yoke 180 produces an electromagnetic field with which the inductor coil 174 coupled to the stage 172 interacts. Thus, the transformer 176 produces an external ac signal that couples ac energy from the primary coil 178 to the inductor coil 174 whenever the inductor coil is immersed in the yoke 180 (see FIG. 15(C)). Use of the ferromagnetic yoke 180 in this manner enhances the coupling between the primary coil 178 and inductor coil 174. Referring to FIG. 15(B) charging begins at step I when the inductor coil 174 begins to enter the yoke 180, moving to the right in the figure, as deceleration of the stage 172 begins. The stage 172 reaches the end of the deceleration phase in step II (FIG. 15(C)) when the stage velocity reaches zero, and then begins to accelerate to the left at step III (FIG. 15(C)). At step IV (FIG. 15(B)), stage acceleration is completed as the inductor coil 174 emerges from the yoke 180.

Recently, significant wireless energy transfer has been demonstrated by means of self-resonant coils interacting in a strong coupling regime, as described in Kurs et al., *Science* 317:83 (2007). Thus, in other embodiments a ferromagnetic transformer may not be necessary.

Figure 16A:
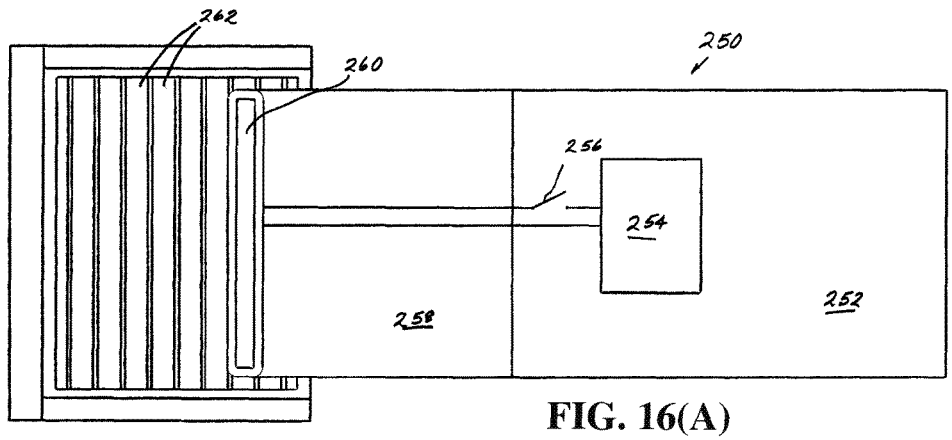
FIGS. 16(A)-16(B) depict yet another embodiment of a device and method for charging a power source located on the fine stage, without having to connect wires to the fine stage.
Figure 16B:
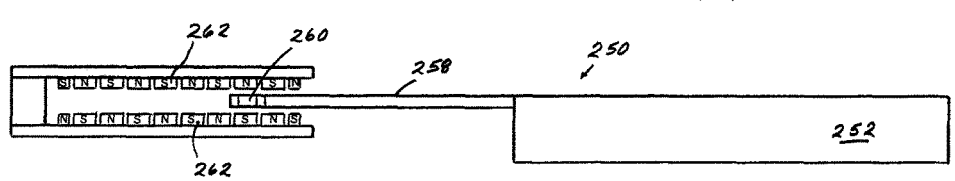

FIGS. 16(A)-16(B) show another embodiment 250 having the capability of charging an on-board electrical source. Shown are a stage 252, a power-source charger 254 mounted to the stage, a switch 256, an extension arm 258 proximally coupled to the stage, and an inductor coil 260 on the distal end of the extension arm. The inductor coil 260 coupled to the stage 252 via the extension arm 258 moves through transverse magnetic fields produced by an array 262 of permanent magnets. In the array 262 the magnet polarity reverses at adjacent locations as shown. As the inductor coil 260 moves through the magnetic fields, current is induced in the inductor coil as a result of the Faraday effect. As the inductor coil 260 moves through each successive magnet pair, the current direction in the coil reverses. Delivery of the current to the power-source charger 254 is controlled by the switch 256, activation of which being controlled by the stage controller (not shown). The dimension of the inductor coil 260 in the direction of stage travel is such that the front part of the coil and the rear part of the coil experience magnetic fields of opposite polarity at any time when the coil is interacting with the magnet array 262. Thus, the currents induced by movement through the magnetic fields add together rather than canceling each other. This alternating current is rectified and conditioned as described above with reference to FIG. 14.

Figure 17A:
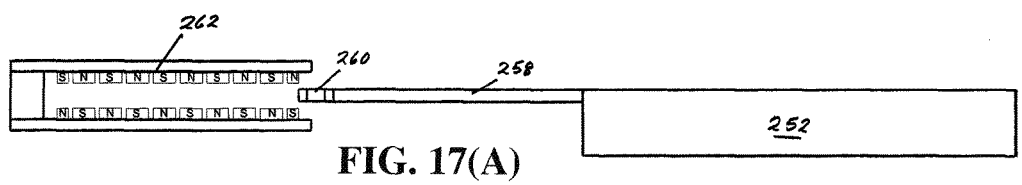
FIGS. 17(A)-17(B) show respective positions of the fine stage during operation of the embodiment of a charging device shown in FIGS. 16(A) and 16(B).
Figure 17B:
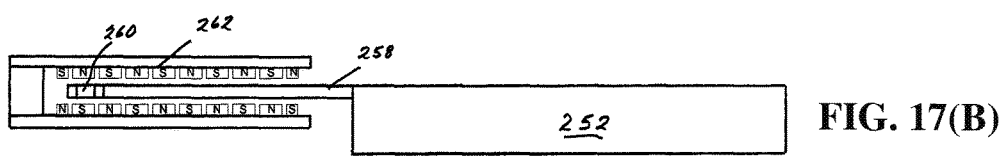

Referring now to FIGS. 17(A) and 17(B), charging begins as the stage 252 moves toward the magnet array 262 at the start of deceleration, resulting in the inductor coil 260 entering the magnet array (FIG. 17(A)). Charging continues to the end of deceleration, when the inductor coil 260 reaches the end of the magnet array 260, as shown in FIG. 17(B). (Although one inductor coil 260 is shown, additional such coils could increase the magnitude of the induced current.) Recharging during stage deceleration provides an additional benefit of helping to slow the stage 252, by a regenerative braking mechanism, thereby reducing stage-motor power. Conversely, if this method were used during stage-acceleration, the stage 252 would feel a retarding force. The retarding force is reduced or eliminated by action of the switch 256 operated by the stage controller (not shown). The switch 256 opens during stage-acceleration phase to prevent current from flowing in the inductor coil 260 during acceleration.

Third Representative Embodiment

Figure 11:
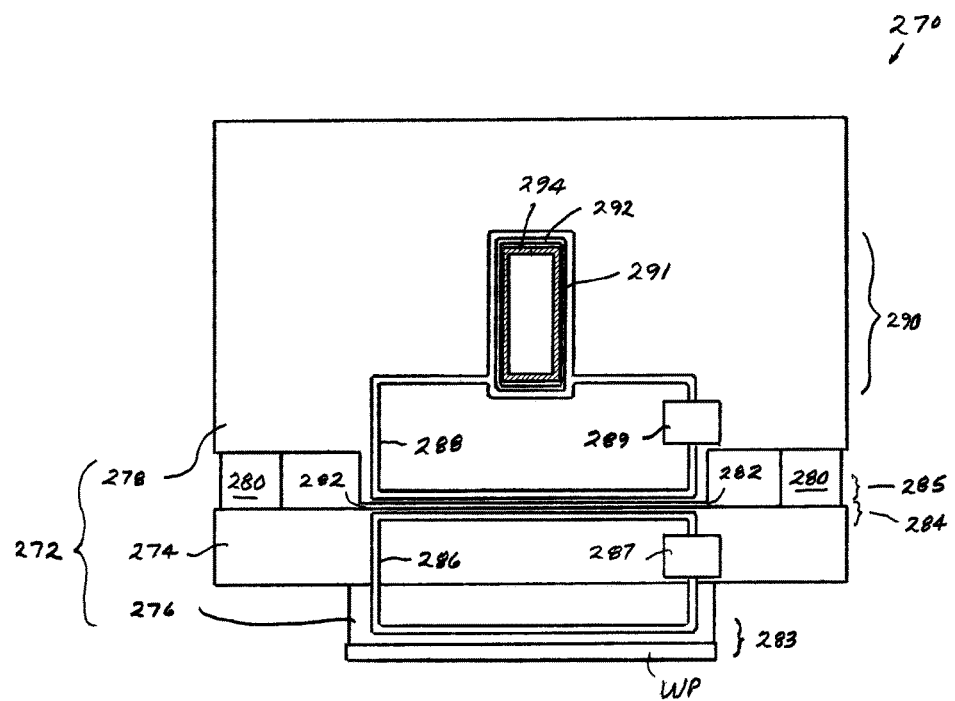
FIG. 11 is a schematic elevational view of a thermally regulated component, according to a third embodiment.

This embodiment 270 is shown in FIG. 11. In this embodiment the component is a movable body 272 consisting of a movable fine stage 274 with attached chuck 276 and a movable coarse stage 278 to which the fine stage is attached using short-range actuators 280. A work piece WP is held by the chuck 276. The fine stage 274 is lighter than the coarse stage 278 and has a higher stage-control bandwidth. Hence, the fine stage 274 can make corrections to positional errors caused by, for example, small errors in coarse-stage position arising from external perturbations and control errors. A small gap 282 separates the coarse and fine stages 278, 274. The gap 282 is sufficiently large to provide a clearance between the stages whenever the fine stage 274 and coarse stage 278 are at their respective limits of closest approach.

A first heat-transfer zone 283 exists near the interface between the chuck 276 and the work piece WP. A second heat-transfer zone 284 exists near the gap 282. A fluid fills the gap 282 to transfer heat between the fine stage 274 and coarse stage 278. The fluid may be a gas or a liquid. In a vacuum application, gas can be supplied to the gap 282 from a hose (not shown) attached to the coarse stage 278. The gas can be scavenged at the periphery of the gap using differential pumping grooves (not shown) that vent through the coarse stage 278 to one or more vacuum pumps (not shown). The connections of the differential pumping grooves to vacuum pump(s) may increase the level of vibrations experienced by the coarse stage 278, but the fine stage 274 can be isolated from the vibrations by its actuators 280 and associated control system (not shown). Heat is transferred from the first heat-transfer zone 283 to the second heat-transfer zone 284 by a first fluidic circuit 286 and associated low-vibration pump 287.

Heat from the second heat-transfer zone 284 is conducted through the fluid in the gap 282 to a third heat-transfer zone 285, where a second fluidic circuit 288 transports the heat to a heat-transfer region 290 including a temperature-controlled guide 294 (see also FIGS. 5(A) and 5(B)). The second fluidic circuit 288 includes a low-vibration pump 289 that circulates fluid between the third heat-transfer zone 285 and the heat-transfer region 290. The heat-transfer region 290 includes a surface 291 cooled by a stage environmental system (e.g., a system that provides a stream of temperature-controlled liquid for cooling purposes; not shown). Between the coarse stage 278 and the heat-transfer region 290 is a fluid-filled gap 292 (e.g., gas-filled gap). So long as the heat-transfer region 290 has a lower temperature than the surface of the stage facing the gap 292, heat will conduct from the coarse stage 278 across the fluid-filled gap 292 to the heat-transfer region 290.

Figure 12A:
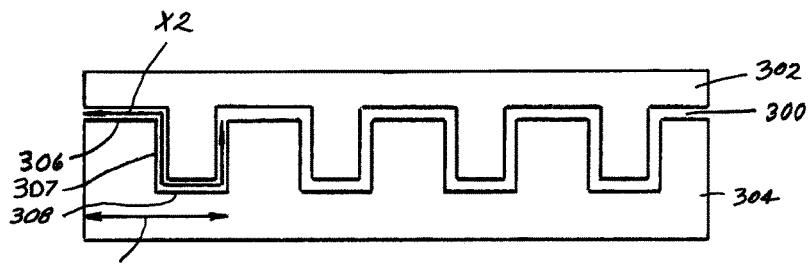
FIG. 12(A) is a schematic diagram of an embodiment of a heat-transfer region having enhanced heat-transfer capability.
Figure 12B:
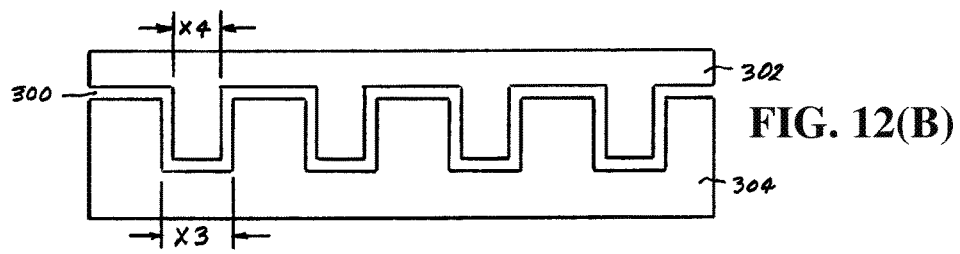
FIGS. 12(B)-12(E) illustrate an exemplary effect of fine-stage motion (relative to the coarse stage) on the heat-transfer region shown in FIG. 12(A).
Figure 12C:
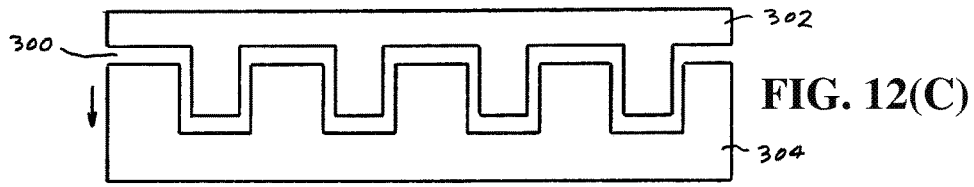
Figure 12D:
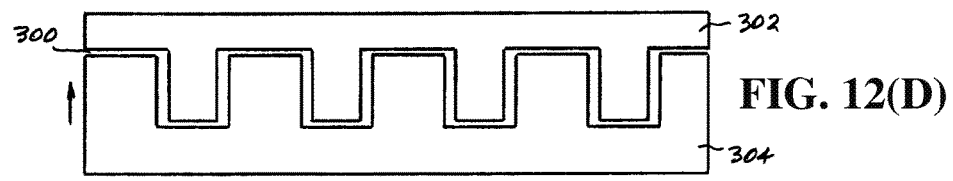
Figure 12E:
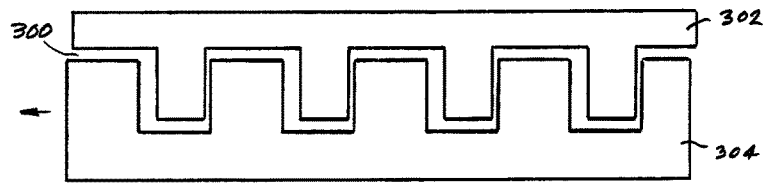

The amount of heat transferred through a unit area of a gap 282 is a function of the width of the gap, the composition and pressure of gas in the gap, and the temperature difference across the gap. For a given condition, it may be desirable to increase the heat-transfer further. This can be done by increasing the heat-transfer area in the gap, e.g., by making the gap non-planar. For example, as shown in FIG. 12(A) a gap 300 between a coarse stage 302 and a fine stage 304 replaces the flat gap 282 shown in FIG. 11. The gap 300 comprises a series of rectilinear (e.g., square) corrugations 306, 307, 308 that increase the area of the gap 300 for heat transfer. In the figure the distance X1 is the projected length of one of the corrugations. The distance X2 is the actual length of the gap region measured along the surface of one corrugation 306-308. Assuming the corrugations extend indefinitely into and out of the page, the increase in heat-transfer area of the corrugated gap 300 to an otherwise similar planar gap is given by the ratio X2/X1. In this example X2/X1=2. If the corrugations were square pegs fitting into square holes, the increase in heat-transfer area would be $(X2/X1)^2=4$ for the present case.

Many other shapes are possible for the corrugations, such as saw-tooth, semicircular, sinusoidal waves, etc. For an application to a variable gap between the fine stage 304 and coarse stage 302, the corrugation dimensions and spacing must be compatible with the relative motion expected from the two stages. FIGS. 12(B)-12(E) illustrate some respective relative motions that are possible in such an application, with the arrows indicating the respective relative motions of the fine stage 304. As an example, horizontal dimensions X3 and X4 of the corrugations must satisfy the following relation, to avoid contact:

$$X3-X4 > x\text{-stroke}_{fine\ stage} \quad (2)$$

Similarly, the vertical gap must exceed the maximum vertical stroke of the fine stage 304 relative to the coarse stage 302.

Figure 13:
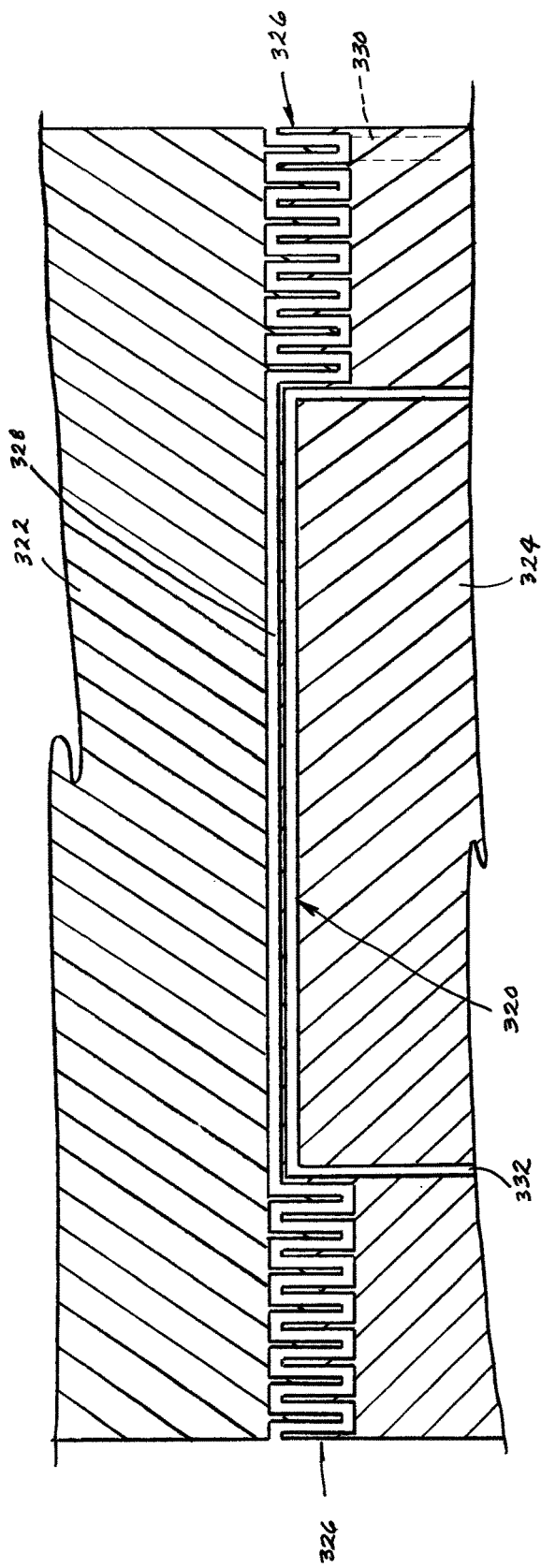
FIG. 13 is a schematic diagram of a gas seal appropriate to the third embodiment.

For vacuum applications, management of gas leakage to the surroundings is challenging because a proximity seal must be large enough to exceed the range of vertical motion of the fine stage 302. Such a large gap will also limit the effectiveness of differential pumping grooves and increase the required pumping rate for both the scavenging pumps and the vacuum-chamber pumps. The leakage rate can be reduced by employing a corrugated-shaped gap as described above. By increasing the surface area of the gap region, gas conductance from the interior of the gap to surrounding space is reduced. This is illustrated in FIG. 13, in which the heat-transfer zone 320 between a coarse stage 322 and fine stage 324 is planar, for simplicity. The heat-transfer zone 320 is surrounded by a corrugated region 326 exhibiting reduced gas conduction from the gap 328 to the surroundings. The type of seal in the corrugated region 326 is referred to as a "labyrinth seal." The seal may be enhanced with the addition of differential pumping grooves (not shown) evacuated via a differential pumping conduit 330. The differential pumping grooves are located within the labyrinth seal to reduce the required pumping rate. Meanwhile, coolant fluid enters the gap 328 via a conduit 332

Figure 18:
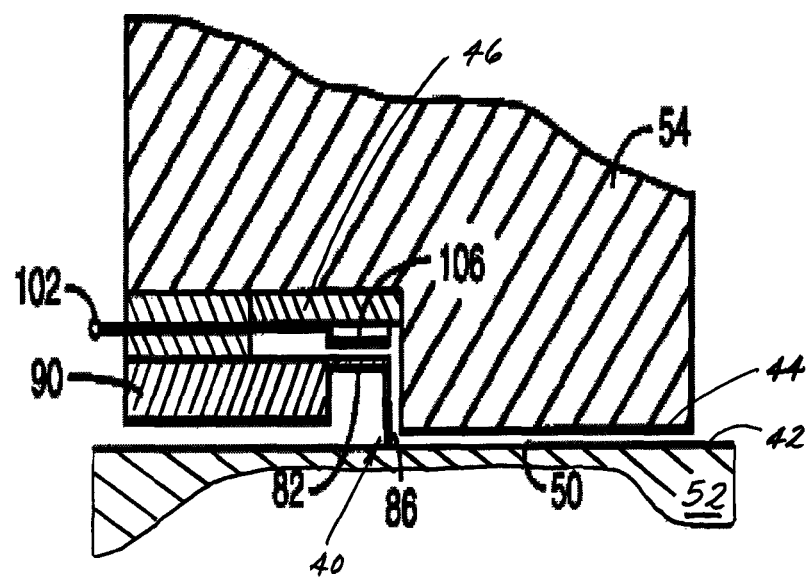
FIG. 18 is a schematic elevational view of a portion of an embodiment of an adjustable gas seal for the gap between the coarse and fine stages.

In yet another embodiment, sealing is achieved by using an active-proximity gap seal, of which the vertical position is adjusted to compensate for relative motions of the fine stage. This particular type of seal is described generally in U.S. Pat. No. 6,126,169 (incorporated herein by reference), and the configuration thereof used in the instant embodiment is shown in FIG. 18. In FIG. 18 an adjustable proximity-gap seal 40 is situated between an upper surface 42 of the fine stage 52 and a lower surface 44 of the coarse stage 54. Adjustability is provided by a sealing sheet 86 mounted on a flexible cantilever 82 that is connected by a mounting structure 90 to the coarse stage 54, just above the gap 50 between the coarse stage and the fine stage 52. This is done by providing an electrode 106 on the lower surface of a plate 46 mounted on the coarse stage 54 just above the cantilever 82. The electrode 106 is in electrical contact with an electric voltage-supply terminal 102 to which a voltage is applied while the cantilever 82 remains electrically grounded. Hence, an electrostatic attractive force is created by application of voltage to the terminal 102, which moves the cantilever 82 upward in the figure to lift the sealing sheet 86 away from the surface 42. The periphery of the heat-transfer region of the gap 50 can be enclosed by a series of such sealing sheets.

The voltage applied to the terminal 102 can come from a fine-stage controller (not shown) that controls the height of the fine stage 52 relative to the coarse stage 54. Alternatively, the voltage can come from proximity sensors (not shown), mounted on the coarse stage 54 or fine stage 52, that monitor the magnitude of the gap 50.

Precision Assembly

Figure 7:
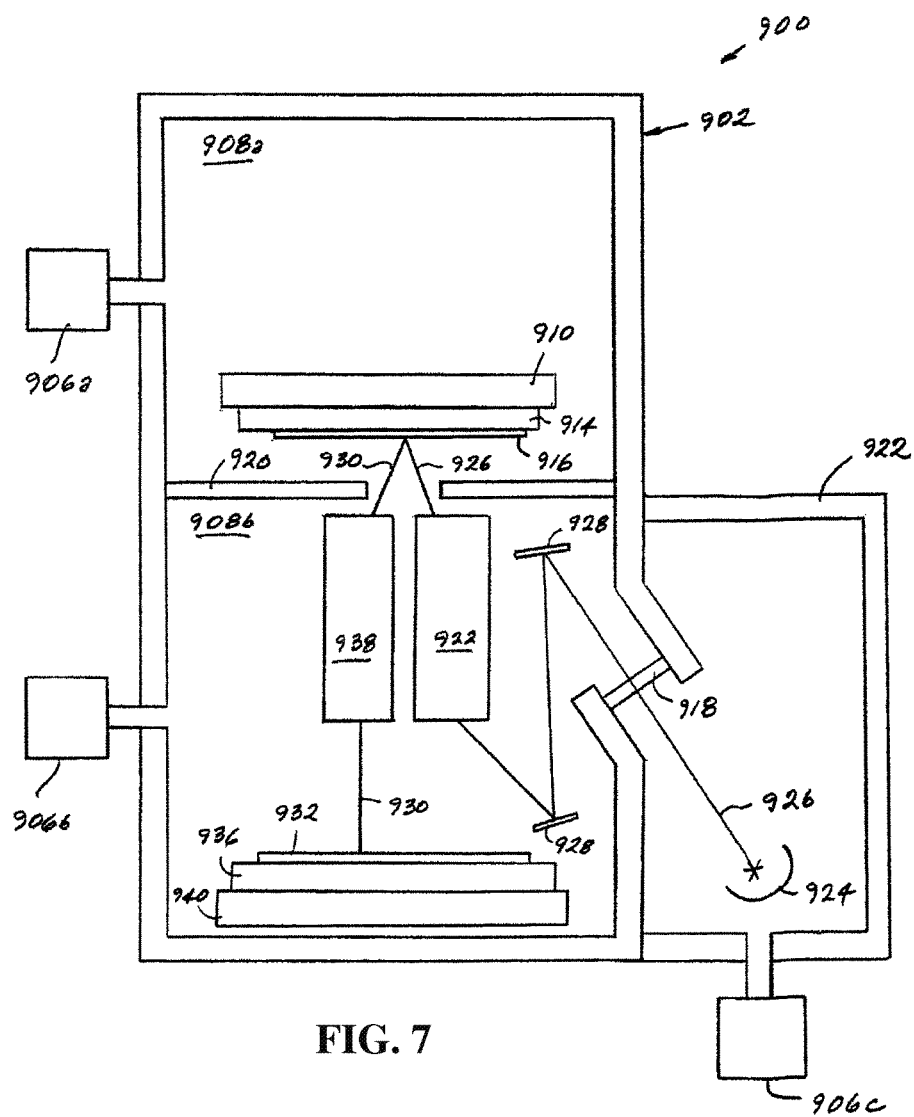
FIG. 7 is a schematic diagram of an embodiment of a precision assembly including at least one cooled component as described herein.

FIG. 7 depicts, as a representative precision assembly, an embodiment of an extreme ultraviolet lithography (EUVL) system 900. The depicted system 900 comprises a vacuum chamber 902 including vacuum pumps 906a, 906b that are arranged to enable desired vacuum levels to be established and maintained within respective chambers 908a, 908b of the vacuum chamber 902. For example, the vacuum pump 906a maintains a vacuum level of approximately 50 mTorr in the upper chamber (reticle chamber) 908a, and the vacuum pump 906b maintains a vacuum level of less than approximately 1 mTorr in the lower chamber (optical chamber) 908b. The two chambers 908a, 908b are separated from each other by a barrier wall 920. Various components of the EUVL system 900 are not shown, for ease of discussion, although it will be appreciated that the EUVL system 900 can include components such as a reaction frame, a vibration-isolation mechanism, various actuators, and various controllers.

An EUV reticle 916 is held by a reticle chuck 914 coupled to a reticle stage 910. The reticle stage 910 can be similar to the stage discussed above in the second embodiment. The reticle chuck 914 holds the reticle 916 and allows the reticle to be moved by the stage laterally in a scanning manner, for example, during use of the reticle for making lithographic exposures. An illumination source 924 is contained in a vacuum chamber 922 evacuated by a vacuum pump 906c. The illumination source 924 produces an EUV illumination beam 926 that is transmitted through a gaseous ND filter 918, as described above, and enters the optical chamber 908b. The illumination beam 926 reflects from one or more mirrors 928 and through an illumination-optical system 922 to illuminate a desired location on the reticle 916. One or more of the mirrors 928 can be configured as discussed above in the first embodiment.

As the illumination beam 926 reflects from the reticle 916, the beam is "patterned" by the pattern portion actually being illuminated on the reticle. The barrier wall 920 defines an aperture 934 through which the illumination beam 926 illuminates the desired region of the reticle 916. The incident illumination beam 926 on the reticle 916 becomes patterned by interaction with pattern-defining elements on the reticle. The resulting patterned beam 930 propagates generally downward through a projection-optical system 938 onto the surface of a wafer 932 held by a wafer chuck 936 on a wafer stage 940 that performs scanning motions of the wafer during exposure. Hence, images of the reticle pattern are projected onto the wafer 932.

The wafer stage 940 can include (not detailed) a positioning stage that may be driven by a planar motor or one or more linear motors, for example, and a wafer table that is magnetically coupled to the positioning stage using an EI-core actuator, for example. The wafer chuck 936 is coupled to the wafer table, and may be levitated relative to the wafer table by one or more voice-coil motors, for example. If the positioning stage is driven by a planar motor, the planar motor typically utilizes respective electromagnetic forces generated by magnets and corresponding armature coils arranged in two dimensions. The positioning stage is configured to move in multiple degrees of freedom of motion, e.g., three to six degrees of freedom, to allow the wafer 932 to be positioned at a desired position and orientation relative to the projection-optical system 938 and the reticle 916.

Movements of the wafer stage 940 and the reticle stage 910 generate reaction forces that may adversely affect performance of the EUVL system 900. Reaction forces generated by motion of the wafer stage 940 may be released mechanically to the floor or ground via a frame member, as discussed in U.S. Pat. No. 5,528,118 and in Japan Kôkai Patent Document No. 8-166475. Reaction forces generated by motions of the reticle stage 910 may be mechanically released to the floor or ground by use of a frame member as described in U.S. Pat. No. 5,874,820 and Japan Kôkai Patent Document No. 8-330224, all of which being incorporated herein by reference in their respective entireties. Vibrations caused by stage motions also can propagate to various locations in the system, including (but not limited to) vibration-sensitive components of one or both the optical systems. Cooling components that are both vibration-sensitive and thermally sensitive in the manner described above helps isolate the components from such vibrations.

An EUVL system 900 including the above described EUV-source 924 and illumination-optical system 922 can be constructed by assembling various assemblies and subsystems in a manner ensuring that prescribed standards of mechanical accuracy, electrical accuracy, and optical accuracy are met and maintained. To establish these standards before, during, and after assembly, various subsystems (especially the illumination-optical system 922 and projection-optical system 938) are assessed and adjusted as required to achieve the specified accuracy standards. Similar assessments and adjustments are performed as required of the mechanical and electrical subsystems and assemblies. Assembly of the various subsystems and assemblies includes the creation of optical and mechanical interfaces, electrical interconnections, and plumbing interconnections as required between assemblies and subsystems. After assembling the EUVL system, further assessments, calibrations, and adjustments are made as required to ensure attainment of specified system accuracy and precision of operation. To maintain certain standards of cleanliness and avoidance of contamination, the EUVL system (as well as certain subsystems and assemblies of the system) are assembled in a clean room or the like in which particulate contamination, temperature, and humidity are controlled.

The subject precision systems are not limited to EUVL systems, to lithography systems utilizing wavelengths other than EUV wavelengths for exposures, or to lithography systems in general. There are a number of different types of lithography systems. For example, the system 900 can be a scanning type lithography system that exposes the pattern from the reticle 916 onto the wafer 932 with the reticle and the wafer moving synchronously. In a scanning type lithographic system, the reticle 916 is moved, in a lateral scanning manner, by the reticle stage 910 while the wafer 932 is being moved in a similar manner by the wafer stage 940. Scanning-exposure of the wafer 932 occurs while the reticle 916 and wafer are moving synchronously.

Alternatively, the exposure system 900 can be a step-and-repeat type of lithography system that exposes the reticle 916 while the reticle and the wafer 932 are stationary. In step-and-repeat, the wafer 932 is in a constant position relative to the reticle 916 and the projection-optical system 938 during the exposure of an individual field. Subsequently, between consecutive exposure steps, the wafer 932 is consecutively moved by the wafer stage 940 in a lateral direction so that the next field of the wafer 932 is brought into position relative to the projection-optical system 938 and the reticle 916 for exposure. Following this process, the images on the reticle 916 are sequentially exposed onto the fields of the wafer 932, and then the next field of the wafer 932 is brought into position relative to the projection-optical system 938 and the reticle.

The use of the system 900 is not limited to photolithography for semiconductor manufacturing. The system 900 can be used, for example, as an LCD photolithography system that exposes a pattern of a liquid crystal display device onto a rectangular glass plate, or a photolithography system for manufacturing a thin-film magnetic head. Alternatively to a photolithography system, the system 900 may be a charged-particle lithography system such as an electron-beam or ion-beam lithography system.

Alternatively to being an EUV source 924, the source can be a g-line source (436 nm), an i-line source (365 nm), a KrF excimer laser (248 nm), an ArF excimer laser (193 nm), an $F_2$ laser (157 nm) or an electron-beam source. In the case in which an electron beam is used, the structure could be such that either a mask is used or a pattern can be directly formed on a substrate without the use of a mask.

The optical assembly 16 projects and/or focuses the radiation from the reticle 28 to the wafer 30. Depending upon the configuration of the exposure apparatus 10, the optical assembly 16 can magnify or reduce the image illuminated on the reticle 28.

Whenever deep-UV radiation such as produced by an excimer laser is used, glass materials such as quartz and fluorite that transmit far ultra-violet rays can be used in the optical assembly 16. Whenever an electron beam is used, electron optics can consist of electron lenses and deflectors. The optical path for the electron beam should be in a vacuum.

With an exposure system that employs vacuum-UV (VUV), having a wavelength of 200 nm or lower, one or both the optical systems 922, 938 can be catadioptric. Examples of catadioptric optical systems include the disclosure of U.S. Pat. Nos. 5,668,672 and 5,835,275. See also U.S. Pat. No. 5,689,377, which discusses use of a reflecting-refracting type of optical system incorporating a concave mirror, etc., but without a beamsplitter. As far as is permitted, the disclosures in the above-mentioned U.S. patents and the Japan patent applications are incorporated herein by reference.

In lithography systems, when linear motors (see U.S. Pat. No. 5,623,853 or 5,528,118) are used in the wafer stage 940 or the reticle stage 910, the linear motors can be either an air-levitation type employing air bearings or a magnetic-levitation type using a Lorentz force or reactance force. The stage can move along a guide or be a guideless stage using no guide. As far as is permitted, the disclosures in U.S. Pat. Nos. 5,623,853 and 5,528,118 are incorporated herein by reference.

The reticle stage 910 and wafer stage 940 desirably include respective measurement systems that monitor movements and positioning of the reticle 916 and the wafer 932 relative to suitable references. With this information, a control system (not shown) can control the reticle stage 910 to position the reticle 916 and the wafer stage 940 to position the wafer 932 precisely. The design of the measurement systems can vary. For example, each measurement system can include multiple laser interferometers, encoders, mirrors, and/or other measuring devices.

A controller is electrically connected to the measurement systems, the stages 910, 940, and to other assemblies of the system 900. In one embodiment the controller receives information from the measurement systems and controls motion of the stages to precisely position the reticle chuck 914 (and thus the reticle 916) and the wafer chuck 936 (and thus the wafer 932).

A stage environmental system can control the temperature of at least a portion of one or both of the stages 910, 940. For example, the stage environmental system can control stage temperatures by directly controlling the respective temperatures of respective heat-exchangers of stages configured as described herein.

Although the stages 910, 940 have been described above in the context of reticle and wafer stages, respectively, this is not intended to be limiting. In alternative embodiments, one or both stages 910, 940 are used to move other things during manufacturing and/or inspection, to move a specimen under an electron microscope, or to move a thing during a precision measurement operation.

Figure 8:
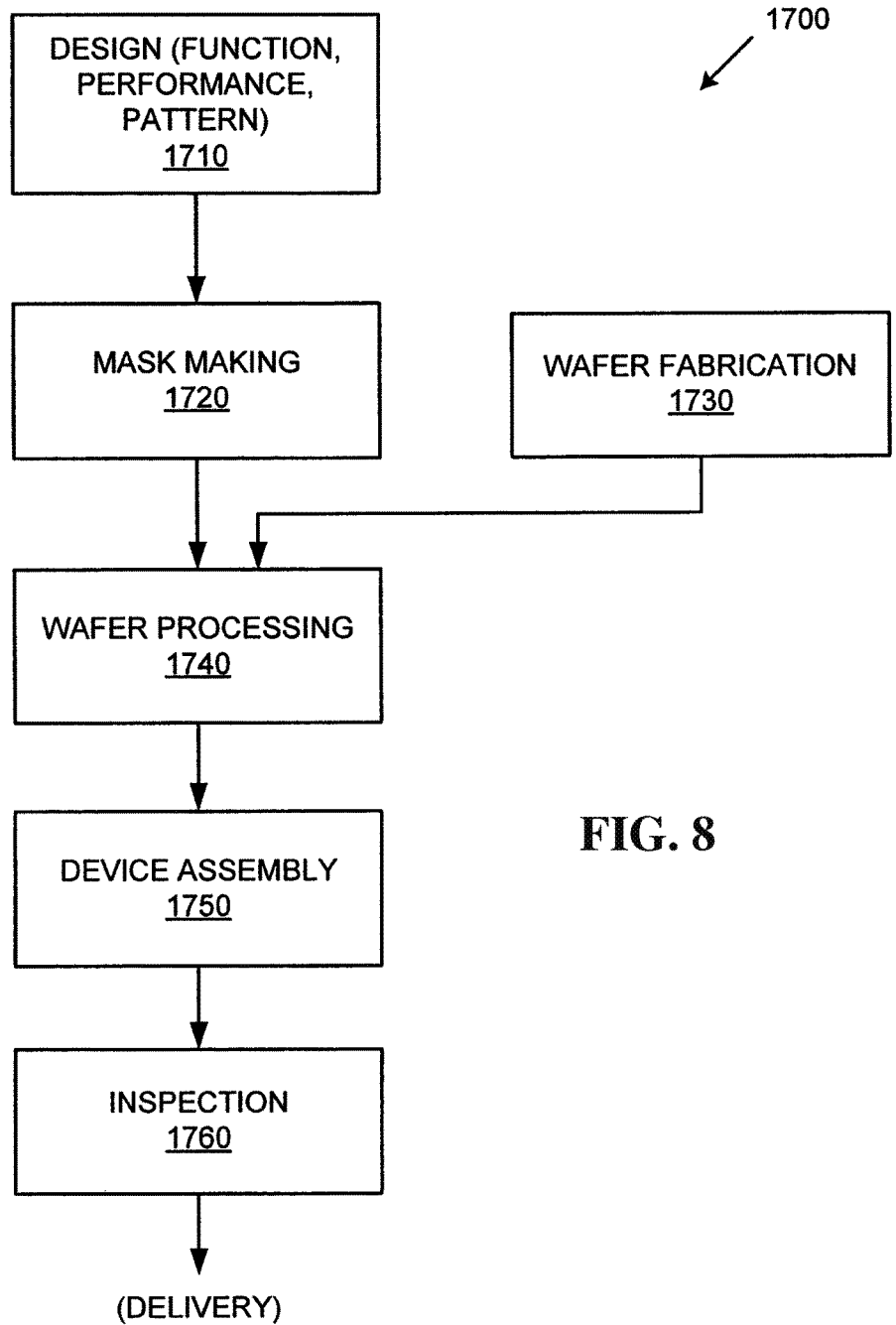
FIG. 8 is a block diagram of a process for fabricating microdevices, wherein the process includes a microlithography step performed using a microlithography system as described herein.

Semiconductor devices can be fabricated by processes including microlithography steps performed using a microlithography system as described above. Referring to FIG. 8, in step 1710 the function and performance characteristics of the semiconductor device are designed. In step 1720 a reticle defining the desired pattern is designed according to the previous design step. Meanwhile, in step 1730, a substrate (wafer) is made and coated with a suitable resist. In step 1740 the reticle pattern designed in step 1720 is exposed onto the surface of the substrate using the microlithography system. In step 1750 the semiconductor device is assembled (including "dicing" by which individual devices or "chips" are cut from the wafer, "bonding" by which wires are bonded to the particular locations on the chips, and "packaging" by which the devices are enclosed in appropriate packages for use). In step 1760 the assembled devices are tested and inspected.

Figure 9:
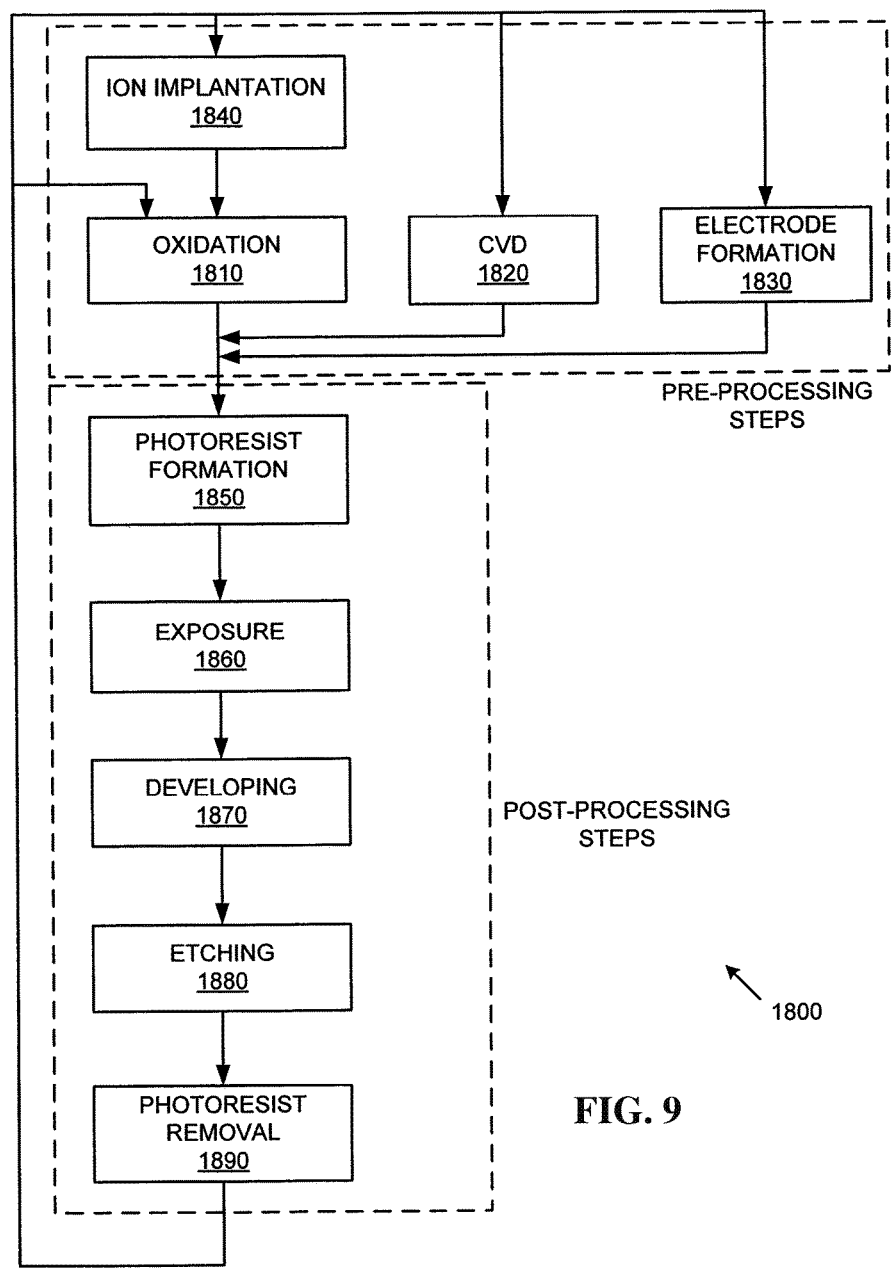
FIG. 9 is a block diagram of a wafer-processing method including a microlithography step.
Figure 10:
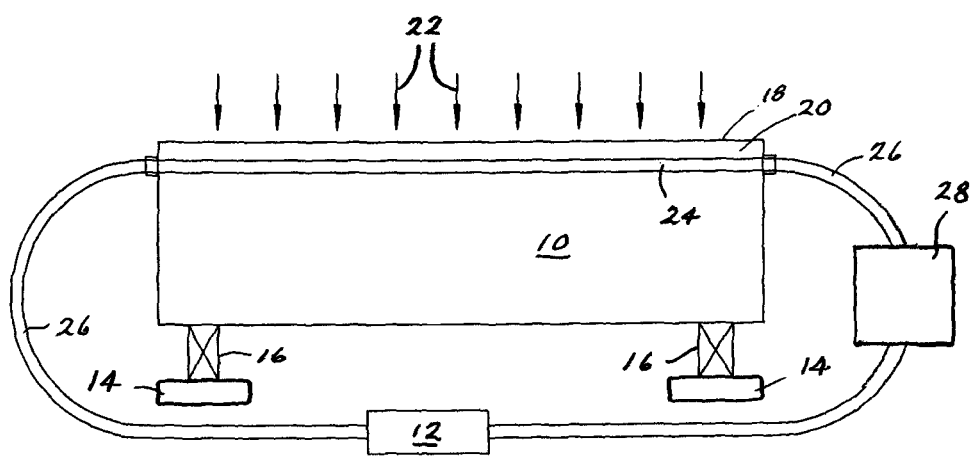
FIG. 10 is a schematic diagram of a conventional device for cooling a mirror.

Representative details of a wafer-processing process including a microlithography step are shown in FIG. 9. In step 1810 (oxidation) the wafer surface is oxidized. In step 1820 (CVD) an insulative layer is formed on the wafer surface. In step 1830 (electrode formation) electrodes are formed on the wafer surface by vapor deposition for example. In step 1840 (ion implantation) ions are implanted in the wafer surface. These steps 1810-1840 constitute representative "pre-processing" steps for wafers, and selections are made at each step according to processing requirements.

At each stage of wafer processing, when the pre-processing steps have been completed, the following "post-processing" steps are implemented. A first post-process step is step 1850 (photoresist formation) in which a suitable resist is applied to the surface of the wafer. Next, in step 1860 (exposure), the microlithography system described above is used for lithographically transferring a pattern from the reticle to the resist layer on the wafer. In step 1870 (development) the exposed resist on the wafer is developed to form a usable mask pattern, corresponding to the resist pattern, in the resist on the wafer. In step 1880 (etching), regions not covered by developed resist (i.e., exposed material surfaces) are etched away to a controlled depth. In step 1890 (photoresist removal), residual developed resist is removed ("stripped") from the wafer.

Formation of multiple interconnected layers of circuit patterns on the wafer is achieved by repeating the pre-processing and post-processing steps as required. Generally, a set of pre-processing and post-processing steps are conducted to form each layer.

Whereas the invention has been described in connection with representative embodiments, it will be understood that it is not limited to those embodiments. On the contrary, it is intended to encompass all alternatives, modifications, and equivalents as may be included within the spirit and scope of the invention as defined by the appended claims.

What is claimed is:

1. A thermally regulated component, comprising:
   a first heat-transfer zone including a first component surface that receives a heating influence;
   a second heat-transfer zone including a second component surface;
   a conduit circuit extending in the component through the first heat-transfer zone, continuing in the component through the second heat-transfer zone, and returning to the first heat-transfer zone, the conduit circuit containing an electrically conductive liquid that includes at least one metal;
   a substantially vibration-free pump coupled to the conduit circuit and inducing flow of the electrically conductive liquid through the conduit circuit; and
   a heat-exchanger situated in thermal contact with the second component surface but separated from the second component surface by a continuous gap that isolates the second component surface from the heat exchanger such that transmission of vibration from the heat-exchanger to the thermally regulated component is substantially prevented.

2. The component of claim 1, wherein:
   the heating influence heats the component in the first heat-transfer zone; and
   the liquid flowing in the conduit circuit absorbs the heat in the first heat-transfer zone and delivers the heat to the second heat-transfer zone, in which zone the heat flows from the liquid to the heat-exchanger.

3. The component of claim 1, wherein:
   the component conducts the heat, received from the heating influence in the first heat-transfer zone, to the liquid in the conduit circuit;
   the liquid in the conduit circuit delivers the heat from the first heat-transfer zone to the second heat-transfer zone; and
   the component conducts the heat from the liquid to the heat-exchanger in the second heat-transfer zone.

4. The component of claim 1, wherein the electrically conductive liquid comprises liquid metal.

5. The component of claim 1, wherein:
   the conduit circuit comprises a first conduit portion in the first heat-transfer zone and a second conduit portion in the second heat-transfer zone; and
   the pump, the first conduit portion, and the second conduit portion are connected together in series in the conduit circuit.

6. The component of claim 5, wherein the heating influence comprises electromagnetic radiation impinging on the first component surface and being absorbed, at least in part, by the component sufficiently to heat the component.

7. The component of claim 6, configured as a reflective optical element.

8. The component of claim 7, wherein the second component surface is obverse to the first component surface.

9. The component of claim 7, wherein:
the liquid in the first conduit portion is heated by absorption of heat from the component in the first heat-transfer zone;
the pump and the conduit circuit circulate the heated liquid from the first heat-transfer zone to the second heat-transfer zone; and
the heat-exchanger absorbs at least a portion of the heat in the liquid in the second conduit portion in the second heat-transfer zone.

10. The component of claim 9, wherein the heat-exchanger is separated from the second component surface by the continuous gap occupied by a thermally conductive fluid.

11. The component of claim 10, wherein the thermally conductive fluid is a gas.

12. The component of claim 11, wherein the gas flows in the continuous gap.

13. The component of claim 10, wherein the continuous gap is situated between a substantially planar surface of the heat-exchanger and the substantially planar second component surface.

14. The component of claim 10, wherein the continuous gap is situated between a surface of the heat-exchanger and the second component surface that are mutually convoluted to increase respective surface areas of the surfaces compared to otherwise similar planar surfaces.

15. The component of claim 5, wherein:
in the component the first conduit portion is separated from the first component surface by a respective defined first distance;
in the component the second conduit portion is separated from the second component surface by a respective defined second distance; and
at least one of the first and second distances is through material of the component.

16. The component of claim 1, wherein:
in the second heat-transfer zone the heat-exchanger is separated from the second component surface by the continuous gap occupied by a thermally conductive gas flowing in the gap;
the continuous gap is situated between a surface of the heat-exchanger and the second component surface; and
the continuous gap is bounded, at least in part, by a labyrinth seal.

17. The component of claim 1, wherein:
in the second heat-transfer zone the heat-exchanger is separated from the second component surface by the continuous gap occupied by a thermally conductive gas flowing in the gap;
the continuous gap is situated between a surface of the heat-exchanger and the second component surface; and
the continuous gap is bounded, at least in part, by at least one differential pumping groove.

18. The component of claim 1, wherein:
in the second heat-transfer zone the heat-exchanger is separated from the second component surface by the continuous gap occupied by a thermally conductive gas flowing in the gap;
the continuous gap is situated between a surface of the heat-exchanger and the second component surface; and
the continuous gap is bounded, at least in part, by at least one proximity seal.

19. The component of claim 18, wherein the proximity seal is an active seal.

20. The component of claim 1, wherein:
the electrically conductive liquid comprises a liquid metal; and
the pump is an MFD pump.

21. The component of claim 20, wherein:
the component comprises a component body extending between the first and second surfaces;
the conduit circuit is situated inside the body; and
the pump is located, at least in part, inside the body.

22. The component of claim 1, further comprising conductors delivering electrical current to the pump from a source separate from the component, the conductors being electrically connected to the pump without directly contacting the component or the pump.

23. The component of claim 22, further comprising a respective liquid-metal connection for each conductor, each connection comprising a well containing liquid metal and the conductor contacting the liquid metal but not the well.

24. The component of claim 1, further comprising a vibration-isolation mounting coupling the component to a support.

25. The component of claim 1, configured as a movable member of a stage.

26. The component of claim 25, wherein:
the movable member comprises a first member portion and a second member portion coupled to the first member portion;
the conduit circuit is situated in the first and second member portions;
the first heat-transfer zone is associated with the first member portion; and
the second heat-transfer zone is associated with the second member portion.

27. The component of claim 26, wherein:
the heat-exchanger comprises a longitudinally extended body;
the second heat-transfer zone comprises a fluid bearing associated at least with the second member portion and configured to move, with the first and second member portions, relative to the longitudinally extended body;
the fluid bearing includes the continuous gap, occupied by a thermally conductive fluid, situated between the bearing and the longitudinally extended body; and
the thermally conductive fluid conducts heat from the second heat-transfer portion across the continuous gap to the body.

28. The component of claim 27, wherein the longitudinally extended body is actively cooled.

29. The component of claim 27, wherein the fluid bearing is situated within the second member portion.

30. The component of claim 27, wherein the second member portion is arranged to conduct flow of the liquid in the second heat-transfer zone as the liquid releases heat in the second heat-transfer zone across the continuous gap to the longitudinally extended body.

31. The component of claim 27, wherein the longitudinally extended body is a guide defining a direction of motion of the movable member.

32. The component of claim 1, wherein the heat-exchanger further comprises:
 a heat-exchanger body having a third heat-transfer zone and a fourth heat-transfer zone, the third heat-transfer zone including a third surface, and the fourth heat-transfer zone including a fourth surface;
 a second conduit circuit extending in the body through the third heat-transfer zone, continuing in the body through the fourth heat-transfer zone, and returning to the third heat-transfer zone, the second conduit circuit containing the electrically conductive liquid; and
 a second substantially vibration-free pump coupled to the second conduit circuit and inducing flow of the electrically conductive fluid through the second conduit circuit.

33. The component of claim 32, wherein:
 the third surface is situated adjacent to, but separated by a defined first gap from, the second component surface; and
 the fourth surface is situated adjacent to, but separated by a defined second gap from, a temperature-regulated surface.

34. The component of claim 33, wherein the first and second gaps contain respective thermally conductive gases.

35. The component of claim 32, wherein the first and second conduit circuits contain liquid metal.

36. The component of claim 32, further comprising at least one vibration-attenuating device situated between the heat-exchanger body and the component.

37. The component of claim 32, wherein the temperature-regulated surface is of a member arranged to guide movement of the heat-exchanger and component relative to the member.

38. The component of claim 1, further comprising at least one electrical conductor connected to a power source and to the pump, the connection to the pump being made without the conductor directly contacting the pump.

39. The component of claim 38, wherein:
 the connection to the pump comprises a volume of liquid metal; and
 the electrical conductor contacts the liquid metal to complete an electrical connection to the pump.

40. The component of claim 1, further comprising:
 an on-board power supply connected to the pump to run the pump;
 an on-board inductor connected to the power supply, the inductor being configured to receive inductive energy from an external AC signal source whenever the inductor is inductively coupled to the external AC signal source.

41. The component of claim 40, wherein the external AC signal source comprises an inductor.

42. The component of claim 40, wherein the external AC signal source comprises a transformer including a ferromagnetic yoke relative to which the on-board inductor can be inductively coupled.

43. The component of claim 40, wherein the external AC signal source comprises an array of magnets of alternating polarity positioned relative to the on-board inductor to excite the on-board inductor whenever the on-board inductor moves relative to the magnet array.

44. The component of claim 43, further comprising an on-board switch connected to the inductor and controlled to open during an acceleration of the component relative to the magnet array.

45. The component of claim 1, configured as a movable reticle chuck mounted to a reticle stage.

46. The component of claim 45, wherein the conduit circuit extends through the reticle chuck and at least a portion of the reticle stage.

47. The component of claim 45, wherein:
 the reticle stage comprises a fine stage and a coarse stage;
 the fine stage includes the reticle chuck through which the conduit circuit extends;
 the fine stage with the reticle chuck is movable relative to the coarse stage; and
 the heat-exchanger is associated with the coarse stage.

48. The component of claim 47, wherein:
 the coarse stage includes a second conduit circuit and pump;
 the second conduit circuit is in thermal contact with the first conduit circuit;
 the second conduit circuit contains an electrically conductive liquid that includes at least one metal; and
 the second conduit circuit is in thermal contact with the heat-exchanger.

49. The component of claim 48, wherein the heat-exchanger comprises a stationary body relative to which the coarse stage is movable.

50. The component of claim 49, wherein:
 the fine stage is separated from the coarse stage by a first gap occupied by a thermally conductive gas; and
 the coarse stage is separated from the stationary body by a second gap occupied by a thermally conductive gas.

51. The component of claim 49, wherein the stationary body comprises a guide bar situated to guide motion of the coarse stage.

52. A precision system, comprising a component as recited in claim 1.

53. The precision system of claim 52, wherein the component comprises a movable body configured to hold an element situated to receive incident radiation that causes heating of the element and thus of the movable body.

54. The component of claim 1, wherein the second component surface is movable relative to the heat-exchanger.

55. The component of claim 1, wherein the continuous gap is occupied by a thermally conductive fluid other than the electrically conductive liquid such that heat, delivered to the second heat-transfer zone by the electrically conductive liquid flowing in the conduit circuit, flows via the thermally conductive fluid from the second component surface across the continuous gap to the heat-exchanger.

56. A mounted optical element, comprising:
 an element body having an incidence surface that receives electromagnetic radiation causing heating of the element body at the incidence surface;
 a thermally regulated mounting body comprising a first heat transfer zone including a first surface and a second heat transfer zone including a second surface, the element body being mounted to the first surface such that heat conducts from the element body to the first surface;
 a conduit circuit comprising a first conduit portion extending in the first heat transfer zone of the mounting body adjacent, but separated from, the first surface, and comprising a second conduit portion extending in the second heat transfer zone of the mounting body adjacent, but separated from, the second surface, and returning to the first heat transfer zone;
 an electrically conductive liquid metal contained in the conduit circuit and in a condition in which the liquid metal can flow in the conduit circuit;

a substantially vibration-free pump coupled to the conduit circuit, the pump being configured to induce flow of the liquid metal through the conduit circuit, from the first conduit portion to the second conduit portion and from the second conduit portion to the first conduit portion; and a heat-exchanger situated in thermal contact with, but not contacting, the second surface, the heat-exchanger being separated from the second surface by a continuous gap that isolates the second surface from the heat-exchanger such that transmission of vibration from the heat-exchanger to the mounting body is substantially prevented, and such that heat delivered to the second surface from the first surface by flow of the liquid metal in the conduit circuit conducts from the second surface to the heat-exchanger.

57. The mounted element of claim 56, wherein the optical element is a reflective optical element.

58. The mounted element of claim 56, wherein the continuous gap is occupied by a thermally conductive fluid.

59. The mounted element of claim 58, wherein the thermally conductive fluid is a gas flowing in the gap.

60. The mounted element of claim 56, wherein the pump is an MFD pump.

61. The mounted element of claim 56, wherein:
the optical element comprises a reflective reticle; and
the mounting body comprises a portion of a chuck configured to hold the reticle.

62. The mounted element of claim 56, wherein the pump is electrically connected to a power source without physically contacting the power source.

63. The mounted element of claim 56, further comprising an on-board power source that is rechargeable by a recharging circuit not in physical contact with either the element body or the mounting body.

64. The mounted element of claim 63, wherein the charging circuit is inductively coupled to the on-board power source.

65. An optical system, comprising:
a support; and
an optical element as recited in claim 56 mounted to the support.

66. The mounted element of claim 56, wherein the second surface is movable relative to the heat-exchanger.

67. A reflective optical element, comprising:
a thermally regulated first body having a first heat transfer zone including a first surface and a second heat transfer zone including a second surface, the first surface being vulnerable to heating;
a conduit circuit comprising a first conduit portion extending through the first heat transfer zone in the first body adjacent, but separated by a defined distance of the first body from, the first surface, and comprising a second conduit portion extending through the second heat transfer zone in the first body adjacent, but separated by a defined distance of the first body from, the second surface, and returning to the first heat transfer zone;
an electrically conductive liquid metal contained in the conduit circuit and in a condition in which the liquid metal can flow in the conduit circuit;
a substantially vibration-free pump coupled to the conduit circuit, the pump being configured to induce flow of the liquid metal through the conduit circuit, from the first conduit portion to the second conduit portion and from the second conduit portion to the first conduit portion; and a heat exchanger situated adjacent and in thermal contact with, but without contacting, the second surface, and separated from the second surface by a continuous gap that isolates the second surface from the heat exchanger such that transmission of vibration from the heat exchanger to the first body is substantially prevented, and such that heat delivered to the second surface from the first surface by flow of the liquid metal in the conduit circuit conducts from the second surface across the continuous gap to the heat-exchanger.

68. The optical element of claim 67, further comprising a second body, wherein:
the second body comprises a radiation-incidence surface and a mounting surface;
the mounting surface is mounted to the first surface of the first body; and
the radiation-incidence surface receives incident electromagnetic radiation, of which at least a portion is absorbed by the second body, causing heating of the second body and thus of the first surface.

69. An optical system, comprising:
a support; and
an optical element as recited in claim 67 mounted to the support.

70. The reflective optical element of claim 67, wherein the second surface is movable relative to the heat-exchanger.

71. A stage, comprising:
a thermally regulated movable body having a first heat transfer zone including a first surface, and a second heat transfer zone including a second surface, the first surface being susceptible to heating;
a conduit circuit comprising a first conduit portion extending in the first heat transfer zone of the body adjacent, but separated by a defined distance of the body from, the first surface, and comprising a second conduit portion extending in the second heat transfer zone of the body adjacent, but separated by a defined distance of the body from, the second surface, and returning to the first heat transfer zone;
an electrically conductive liquid metal contained in the conduit circuit and in a condition in which the liquid metal can flow in the conduit circuit;
a substantially vibration-free pump mounted at least partially in the body and coupled to the conduit circuit, the pump being configured to induce flow of the liquid metal through the conduit circuit, from the first conduit portion to the second conduit portion and from the second conduit portion to the first conduit portion; and
a heat exchanger arranged in thermal contact with, but not contacting the second surface;
wherein the second surface comprises a respective portion of a gas bearing;
wherein the heat exchanger comprises a respective portion of a longitudinally extended body relative to which the gas bearing is movable;
wherein the gas bearing is defined, at least in part, by a continuous gap between the longitudinally extended body and the second surface, the continuous gap isolating the movable body from the heat exchanger such that transmission of vibration from the heat exchanger to the movable body is substantially prevented.

72. The stage of claim 71, wherein the gap is occupied by a flowing gas.

73. The stage of claim 71, wherein the longitudinally extended body is actively cooled.

74. The stage of claim 71, wherein the pump is an MFD pump.

75. The stage of claim 71, wherein the stage is configured to hold a pattern master on the first surface, the pattern master being susceptible to heating by electromagnetic radiation directed to and incident on the pattern master.

76. A precision system, comprising:
a frame; and
a stage as recited in claim 71 mounted to the frame.

77. The stage of claim 71, wherein the second surface is movable relative to the heat-exchanger.

78. A method for cooling an object having first and second surfaces, wherein the first surface is subject to an external heating influence, the method comprising:
flowing an electrically conductive liquid in a first path in the object adjacent, but separated by a first distance from, the first surface to allow the liquid in the first path to absorb heat conducted by the object across the first distance from the first surface;
flowing the electrically conductive liquid from the first path to a second path adjacent, but separated by a second distance from, the second surface to allow the liquid in the second path to conduct heat across the second distance to the second surface; and
as the heat is conducted to the second surface, conducting at least a portion of the heat from the second surface across a gap to the heat exchanger, without contacting the heat exchanger to the object, to remove heat from the second surface, the gap isolating the second surface from the heat exchanger such that transmission of vibration from the heat exchanger to the object is substantially prevented.

79. The method of claim 78, wherein the steps of flowing the electrically conductive liquid comprise flowing a liquid metal.

80. The method of claim 78, further comprising returning the liquid in the second path to the first path to continue flowing of the liquid in the first path.

81. The method of claim 78, wherein the steps of flowing the electrically conductive liquid comprises flowing the liquid in a substantially vibration-free manner.

82. The method of claim 78, wherein:
the object comprises a reflective optical element having a radiation-incidence surface; and
the method further comprises conducting heat from the radiation-incidence surface to the first surface of the object.

83. The method of claim 82, further comprising mounting the reflective optical element to the first surface of the object.

84. The method of claim 78, further comprising:
powering the pump from an on-board power source; and
without contacting the object, charging the on-board power source as required to maintain an ability of the power source to power the pump.

85. The method of claim 84, wherein the charging step comprises:
connecting an inductor to the on-board power source; and
inductively coupling the inductor to a remote charging circuit without contacting inductor to the remote circuit.

86. The method of claim 78, further comprising flowing a thermally conductive fluid, different from the electrically conductive liquid, in the gap.

87. A lithography system, comprising:
a frame;
an optical system mounted to the frame and comprising at least one optical component;
a stage comprising a stage platform situated relative to the optical system;
wherein at least one of the optical component and the stage platform is a thermally regulated component that comprises (a) first and second heat-transfer zones, the first heat-transfer zone including a first component surface that receives a heating influence, the second heat-transfer zone including a second component surface; (b) a conduit circuit extending in the component through the first heat-transfer zone and the second heat-transfer zone, and returning to the first heat-transfer zone; (c) an electrically conductive liquid, comprising at least one metal, contained in the conduit circuit; (d) a substantially vibration-free pump coupled to the conduit circuit and operable to induce flow of the liquid through the conduit circuit; and (e) a heat-exchanger situated in thermal contact with, but not contacting, the second component surface, the heat-exchanger and the second component surface being separated by a continuous gap that isolates the second component surface from the heat-exchanger such that transmission of vibration from the heat-exchanger to the thermally regulated component is substantially prevented.

88. The system of claim 87, wherein:
the thermally regulated component is a reflective optical element irradiated with a beam of extreme-UV radiation;
the stage platform is thermally regulated; and
the stage platform comprises a chuck configured to hold the reflective optical element on the stage platform.

89. The system of claim 88, wherein the reflective optical element is a reflective reticle.

90. The system of claim 87, configured as an extreme UV lithography system.

91. The system of claim 87, wherein the second heat-transfer zone is movable relative to the heat-exchanger.

92. A device for cooling a component, comprising:
a movable body to which the component is mountable, the body having first and second surfaces, wherein the first surface is susceptible to heating;
a conduit circuit comprising a first conduit portion extending in the body adjacent, but separated by a defined distance of the body from, the first surface, and comprising a second conduit portion extending in the body adjacent, but separated by a defined distance of the body from, the second surface;
a liquid metal contained in the conduit circuit and in a condition in which the liquid metal can flow in the conduit circuit;
a substantially vibration-free pump mounted at least partially in the body and coupled to the conduit circuit, the pump being configured to induce flow of the liquid metal through the conduit circuit, from the first conduit portion to the second conduit portion and from the second conduit portion to the first conduit portion; and
a heat exchanger separated by a gap from the second surface so as to be arranged in thermal contact with, but not contacting the second surface, the gap isolating the second surface from the heat exchanger such that transmission of vibration from the heat exchanger to the body is substantially prevented.

93. The device of claim 92, further comprising an on-board power supply that is mounted to the movable body, movable with the movable body, and electrically connected to the pump.

94. The device of claim 93, further comprising a first inductor connected to the on-board power supply and configured to receive inductive energy from an external AC signal source whenever the first inductor is inductively coupled to the external AC signal source, the inductive energy being used for charging the on-board power supply.

95. The device of claim 94, wherein the external AC signal source comprises a second inductor relative to which the first inductor can be inductively coupled as needed to receive electrical energy from the external AC signal source via the second inductor.

96. The device of claim 95, wherein the movable body is selectively positionable to couple the first inductor to the second inductor at selected times during motion of the movable body.

97. The device of claim 94, wherein the external AC signal source comprises an array of magnets of alternating polarity positioned relative to the first inductor to excite the first inductor whenever the first inductor moves relative to the magnet array.

98. The device of claim 92, wherein the second surface is movable relative to the heat-exchanger.

99. The device of claim 92, further comprising an actuator connected to the movable body, the actuator moving the second surface relative to the heat exchanger.

100. The device of claim 92, further comprising a thermally conductive fluid, different from the liquid metal, contained in the gap in a condition in which the fluid can flow in the gap.

101. A thermally regulated component, comprising:
- a first heat-transfer zone including a first component surface that receives a heating influence;
- a second heat-transfer zone including a second component surface;
- a conduit circuit extending in the component through the first heat-transfer zone, continuing in the component through the second heat-transfer zone, and returning to the first heat-transfer zone, the conduit circuit containing an electrically conductive liquid that includes at least one metal;
- a substantially vibration-free pump coupled to the conduit circuit and inducing flow of the electrically conductive liquid through the conduit circuit; and
- a heat-exchanger situated in thermal contact with the second component surface but detached and separated from the second component surface by a continuous gap that substantially prevents transmission of vibrations across the continuous gap.

\* \* \* \* \*